(12) United States Patent
Lee et al.

(10) Patent No.: US 12,245,467 B2
(45) Date of Patent: Mar. 4, 2025

(54) DISPLAY DEVICE

(71) Applicant: Samsung Display Co., Ltd., Yongin-Si (KR)

(72) Inventors: Hyeon Bum Lee, Hwaseong-si (KR); Hyun Duck Cho, Anyang-si (KR); Chi Wook An, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 536 days.

(21) Appl. No.: 17/526,006

(22) Filed: Nov. 15, 2021

(65) Prior Publication Data

US 2022/0367585 A1 Nov. 17, 2022

(30) Foreign Application Priority Data

May 17, 2021 (KR) .................. 10-2021-0063428

(51) Int. Cl.
| | |
|---|---|
| *H10K 59/123* | (2023.01) |
| *H10K 50/84* | (2023.01) |
| *H10K 50/86* | (2023.01) |
| *H10K 59/35* | (2023.01) |
| *H10K 59/40* | (2023.01) |

(52) U.S. Cl.
CPC .......... *H10K 59/123* (2023.02); *H10K 50/84* (2023.02); *H10K 50/865* (2023.02); *H10K 59/353* (2023.02); *H10K 59/40* (2023.02)

(58) Field of Classification Search
CPC .... H10K 59/123; H10K 59/353; H10K 59/40; H10K 59/8792; H10K 59/121; H10K 59/122; H10K 59/87; H10K 59/8791; H10K 59/352; H10K 59/35; H10K 59/126; H10K 50/84; H10K 50/865
See application file for complete search history.

(56) References Cited

U.S. PATENT DOCUMENTS

| | | | | |
|---|---|---|---|---|
| 2009/0256169 | A1* | 10/2009 | Yokoyama | H10K 71/421 |
| | | | | 257/E21.159 |
| 2014/0231790 | A1* | 8/2014 | Fujino | H10K 59/38 |
| | | | | 257/89 |
| 2021/0200363 | A1* | 7/2021 | Lee | H10K 50/84 |
| 2022/0320064 | A1* | 10/2022 | Takahashi | H04M 1/0266 |

FOREIGN PATENT DOCUMENTS

| | | |
|---|---|---|
| KR | 10-1791797 B1 | 11/2017 |
| KR | 10-2019-0072822 A | 6/2019 |
| KR | 10-2020-0081911 A | 7/2020 |
| KR | 10-2021-0008203 A | 1/2021 |

* cited by examiner

*Primary Examiner* — Sitaramarao S Yechuri
(74) *Attorney, Agent, or Firm* — Innovation Counsel LLP

(57) ABSTRACT

A display device includes a pixel electrode, a wall layer, an emission layer, a touch electrode, and a light blocking member. The wall layer includes an opening exposing the pixel electrode. The emission layer overlaps the pixel electrode. The light blocking member overlaps the touch electrode and includes a first opening and a second opening each exposing the emission layer. A first perimeter section of the first opening is spaced from a first perimeter section of the opening by a first distance in a first direction in a plan view of the display device. A second perimeter section of the first opening is spaced from a second perimeter section of the opening by a second distance in a second direction in the plan view. The second distance is equal to the first distance. The second direction is at 45 degrees relative to the first direction.

19 Claims, 25 Drawing Sheets

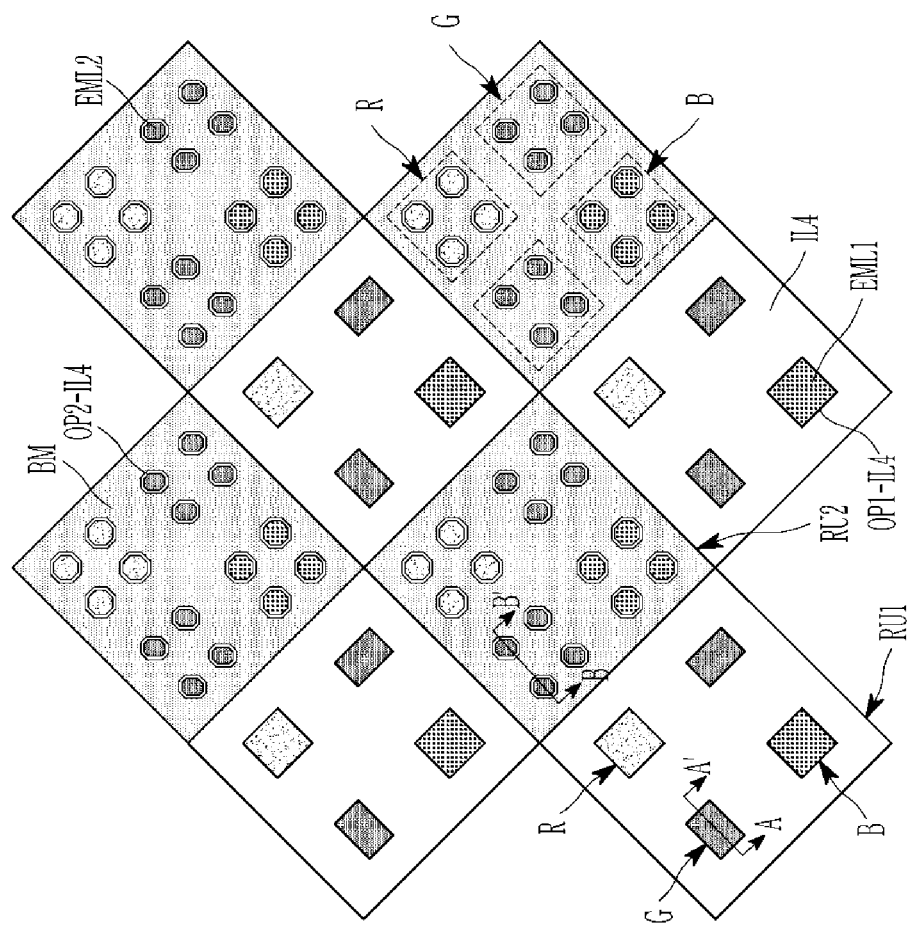

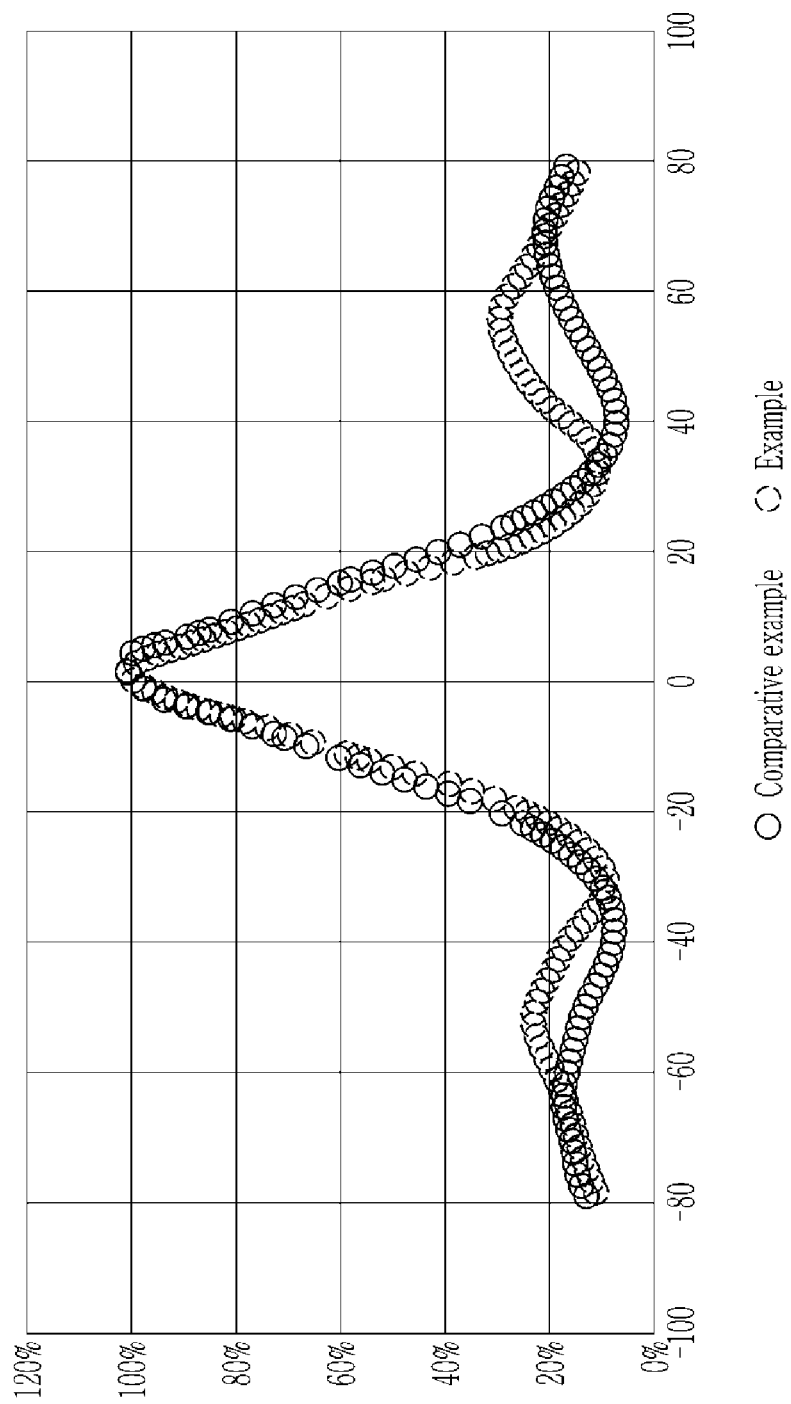

DISPLAY DEVICE

CROSS-REFERENCE TO RELATED APPLICATION

This application claims priority to Korean Patent Application No. 10-2021-0063428, filed in the Korean Intellectual Property Office on May 17, 2021; the Korean Patent Application is incorporated by reference.

BACKGROUND (a) Field

The technical field relates to a display device.

(b) Description of the Related Art

A display device may display images according to input signals. Modern display devices may include liquid crystal display (LCD) devices, plasma display panel (PDP) devices, organic light emitting diode (OLED) devices, field effect display (FED) devices, and electrophoretic display devices. Display devices may be included in various electronic devices, such as mobile phones, navigation units, digital cameras, electronic books, portable game machines, and terminals.

The Background section is for understanding of the background of the application. The Background section may contain information that does not form the prior art that is already known in this country to a person of ordinary skill in the art.

SUMMARY

Embodiments may be related a display device having a privacy protection mode.

An embodiment may be related to a display device that includes the following elements: a transistor positioned on a substrate; a first electrode connected to the transistor; a partition wall positioned on the first electrode; a second electrode overlapping the first electrode; an emission layer disposed between the first electrode and the second electrode; an encapsulation layer disposed on the second electrode; a first touch insulating layer disposed on the encapsulation layer; a touch electrode positioned on the first touch insulating layer; and an overcoat layer disposed on the touch electrode, wherein a first pixel unit and a second pixel unit are repeatedly positioned on the substrate, the second pixel unit is positioned on the touch electrode and further includes a light blocking member including light transmitting openings, at least two or more of the light transmitting openings and the emission layer included in the second pixel unit overlap, and a first distance between an edge of the light blocking member and an edge of the partition wall in a first direction and a second distance between an edge of the light blocking member and an edge of the partition wall in a diagonal direction that is inclined by 45 degrees with respect to the first direction are the same.

The partition wall may include first partition wall openings included in the first pixel unit and second partition wall openings included in the second pixel unit.

Shapes of the first partition wall openings and the second partition wall openings may be different.

Each of the light transmitting openings may have an octagonal or circular shape in a plan view.

The second partition wall openings and the light transmitting openings may overlap.

Each of the second partition wall openings may have an octagonal or circular shape in a plan view.

A size of the first electrode included in the first pixel unit and a size of the first electrode included in the second pixel unit may be different.

The size of the first electrode included in the first pixel unit may be smaller than the size of the first electrode included in the second pixel unit.

The emission layer may include: a first emission layer included in the first pixel unit; and a second emission layer included in the second pixel unit.

One pixel included in the second pixel unit may include a plurality of emission areas that are spaced apart from each other.

The second emission layer may overlap the second partition wall openings.

The second emission layer may overlap upper and side surfaces of a second partition wall positioned between the second partition wall openings.

The light blocking member may be positioned on the overcoat layer.

The light blocking member may cover the touch electrode.

The first partition wall openings may overlap the first emission layer.

A number of the first partition openings overlapping the first emission layer and a number of the second partition wall openings overlapping the second emission layer may be the same.

An embodiment may be related to a display device that includes the following elements: a transistor positioned on a substrate; a first electrode connected to the transistor; a second electrode overlapping the first electrode; a partition wall positioned between the first electrode and the second electrode to have first partition wall openings and second partition wall openings; a first emission layer overlapping the first partition openings; a second emission layer configured to overlap at least two or more of the second partition wall openings; an encapsulation layer disposed on the second electrode; a first touch insulating layer disposed on the encapsulation layer; a touch electrode positioned on the first touch insulating layer; and an overcoat layer disposed on the touch electrode, wherein a first pixel unit including the first partition wall openings and the first emission layer and a second pixel unit including the second partition wall openings and the second emission layer are alternately positioned, the second pixel unit is positioned on the touch electrode, and further includes a light blocking member including light transmitting openings, at least two or more of the light transmitting openings and the emission layer overlap, and a first distance between the light transmitting opening and the second partition wall opening in a first direction and a second distance between the light transmitting opening and the second partition wall openings in a diagonal direction that is inclined by 45 degrees with respect to the first direction are the same.

Each of the light transmitting openings and the second partition wall openings may have an octagonal or circular shape in a plan view.

A size of the first electrode included in the second pixel unit may be larger than a size of the first electrode included in the first pixel unit.

The second emission layer may overlap at least two or more of the second partition openings, and one pixel may include a plurality of emission areas that are spaced apart from each other.

An embodiment may be related to a display device. The display device may include a first transistor, a first pixel electrode, a second transistor, a second pixel electrode, a wall layer, a common electrode, a first transmission layer, a second transmission layer, an encapsulation layer, a first touch insulating layer, a first touch electrode, an overcoat layer, and a light blocking member. The first pixel electrode may be electrically connected to the first transistor. The second pixel may be electrode electrically connected to the second transistor. The wall layer may include a first hole and a second hole, the first hole exposing the first pixel electrode, the second hole exposing the second pixel electrode. The common electrode may overlap both the first pixel electrode and the second pixel electrode. The first emission layer may be disposed between the first pixel electrode and the common electrode. The second emission layer may be disposed between the second pixel electrode and the common electrode. The encapsulation layer may be disposed on the common electrode. The first touch insulating layer may be disposed on the encapsulation layer. The first touch electrode may be positioned on the first touch insulating layer and may overlap the encapsulation layer. The overcoat layer may be disposed on the first touch electrode. The light blocking member may overlap the first touch electrode and may include a first opening and a second opening, each of the first opening and the second opening exposing the second emission layer. A first perimeter section of the first opening may be parallel to a first perimeter section of the second hole and spaced from the first perimeter section of the second hole by a first distance in a first direction in a plan view of the display device. A second perimeter section of the first opening may be parallel to a second perimeter section of the second hole and spaced from the second perimeter section of the second hole by a second distance in a second direction in the plan view of the display device. The first distance may be equal to the second distance. The first direction may be normal/perpendicular to the first perimeter section of the first opening. The second direction may be normal/perpendicular to the second perimeter section of the first opening and may be oriented at 45 degrees with respect to the first direction.

The second hole may be within the first opening in the plan view of the display device.

In the plan view of the display device, a shape of the first hole may be different from a shape of the second hole.

The first opening may be octagonal or circular in the plan view of the display device.

A position of the second hole overlaps with a position of the first opening.

The second hole may be octagonal or circular in the plan view of the display device.

The first pixel electrode may be smaller or larger than the second pixel electrode.

The first pixel electrode may be smaller than the second pixel electrode.

The wall layer may include a third hole. The third hole may be spaced from the second hole and may expose the second pixel electrode.

A first section of the second emission layer may be positioned inside the second hole. A second section of the second emission layer may be positioned inside the third hole. A section of the wall layer may be positioned between the first section of the second emission layer and the second section of the second emission layer.

The section of the wall layer may be positioned between a third section of the second emission layer and the second pixel electrode.

A fourth section of the second emission layer may overlap a side surface of the section of wall layer, may be connected between the first section of the second emission layer and the third section of the second emission layer, and may be directly connected to each of the first section of the second emission layer and the third section of the second emission layer.

The light blocking member may be spaced from the first touch electrode by the overcoat layer and may directly contact the overcoat layer.

The light blocking member may cover and directly contact the first touch electrode.

The first emission layer may be positioned farther than the second emission layer from the overcoat layer.

The wall layer may include a first plurality of openings and a second plurality of openings. The first plurality of openings may include the first hole and may expose the first pixel electrode. The second plurality of openings may include the second hole and may expose the second pixel electrode. A total number of openings of the first plurality of openings may be equal to a total number of openings of the second plurality of openings.

The display device may include a second touch electrode positioned closer to the first emission layer than to the second emission layer and formed of a same material as the first touch electrode. No pixel electrode analogous to the first pixel electrode or the second pixel electrode may be positioned between the first pixel electrode and the second pixel electrode. No light blocking member formed of a same material as the light blocking member may cover the second touch electrode.

Each of the first opening and the second hole is octagonal or circular in the plan view of the display device.

The second pixel electrode may be larger than the first pixel electrode.

The wall layer may include a third hole. The third hole may be spaced from the second hole and may expose the second pixel electrode. Two sections of the second emission layer may be respectively positioned inside the second hole and the third hole.

According to embodiments, a display device may have a satisfactory privacy protection mode.

BRIEF DESCRIPTION OF THE DRAWINGS

FIG. 4A illustrates a top plan view showing a first pixel unit and a second pixel unit according to an embodiment.

FIG. 11A and FIG. 11B illustrate graphs showing changes in luminance for angles in an example and a comparative example in which a distance between a perimeter of an opening/hole of a light blocking member and a perimeter of an opening/hole of a partition wall is adjusted.

DETAILED DESCRIPTION OF EMBODIMENTS

Figure 1A:
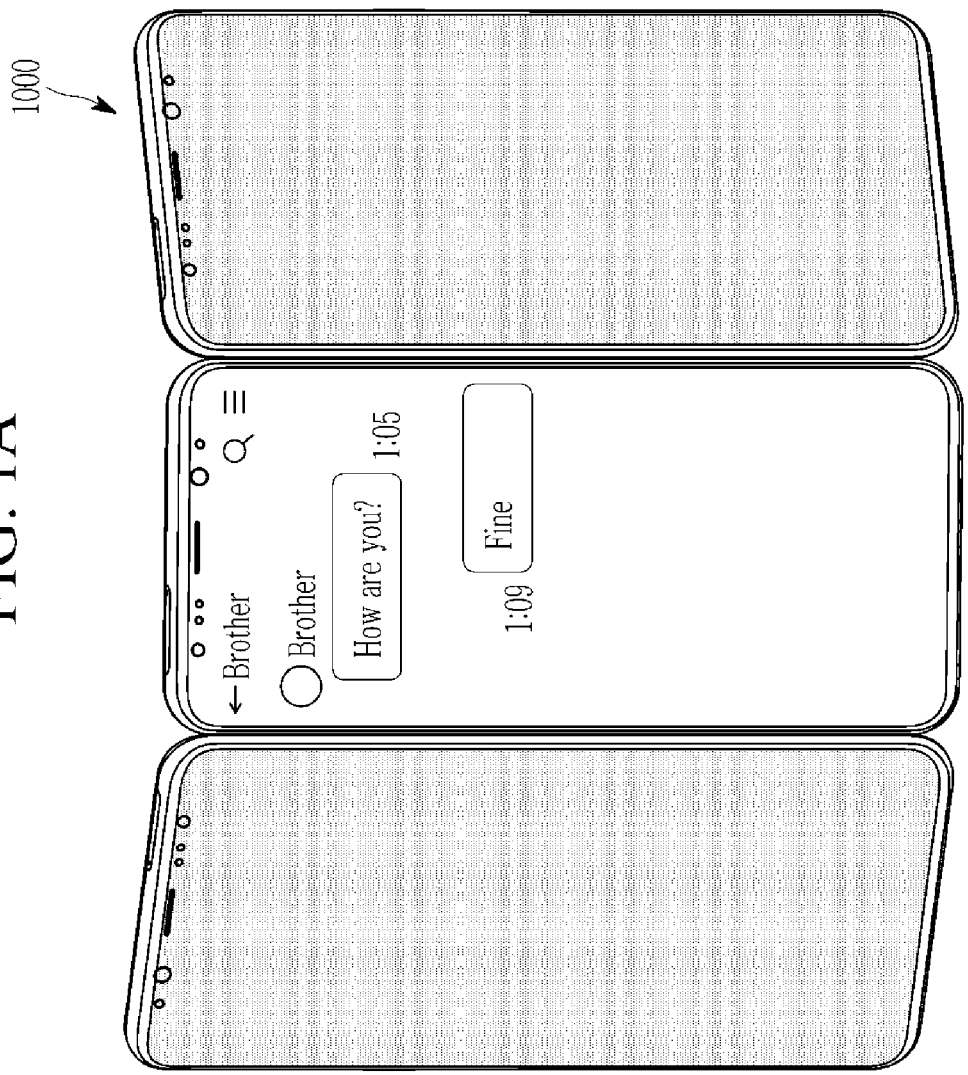
FIG. 1A illustrates a perspective view of three display devices a according to an embodiment.

Illustrative embodiments are described with reference to the accompanying drawings. The described embodiments may be modified in various ways.

Same numerals may refer to identical or similar elements.

Embodiments are not limited to the illustrated dimensions. In the drawings, dimensions of elements may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly or indirectly on the second element.

Unless explicitly described to the contrary, the words "comprise" and "include" may indicate the inclusion of stated elements but not the exclusion of any other elements.

The term "first electrode" may mean "pixel electrode." The term "second electrode" may mean "common electrode." The term "partition wall" may mean "wall layer." The term "connect" may mean "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the lengthwise direction of the element is in the particular direction. The expression that an opening overlaps an object may mean that the opening exposes the object and/or the position of the opening overlaps with the position of the object. The expression that an element is repeated disposed may mean that copies of the element are disposed. The expression that a first element and a second element are alternately positioned may mean that instances/copies of the first element and instances/copies of the second element are alternately positioned. The term "partition wall opening" may mean "hole" or "through hole." The term "distance" may mean "minimum distance." The term "perimeter section" may mean "section of a/the perimeter." The term "extend" may mean "extend lengthwise." The term "multilayer" may mean "multilayer member" or "multilayer structure." The expression "include a material" may mean "be formed of the material." The term "contact" may mean "directly contact."

Figure 1B:
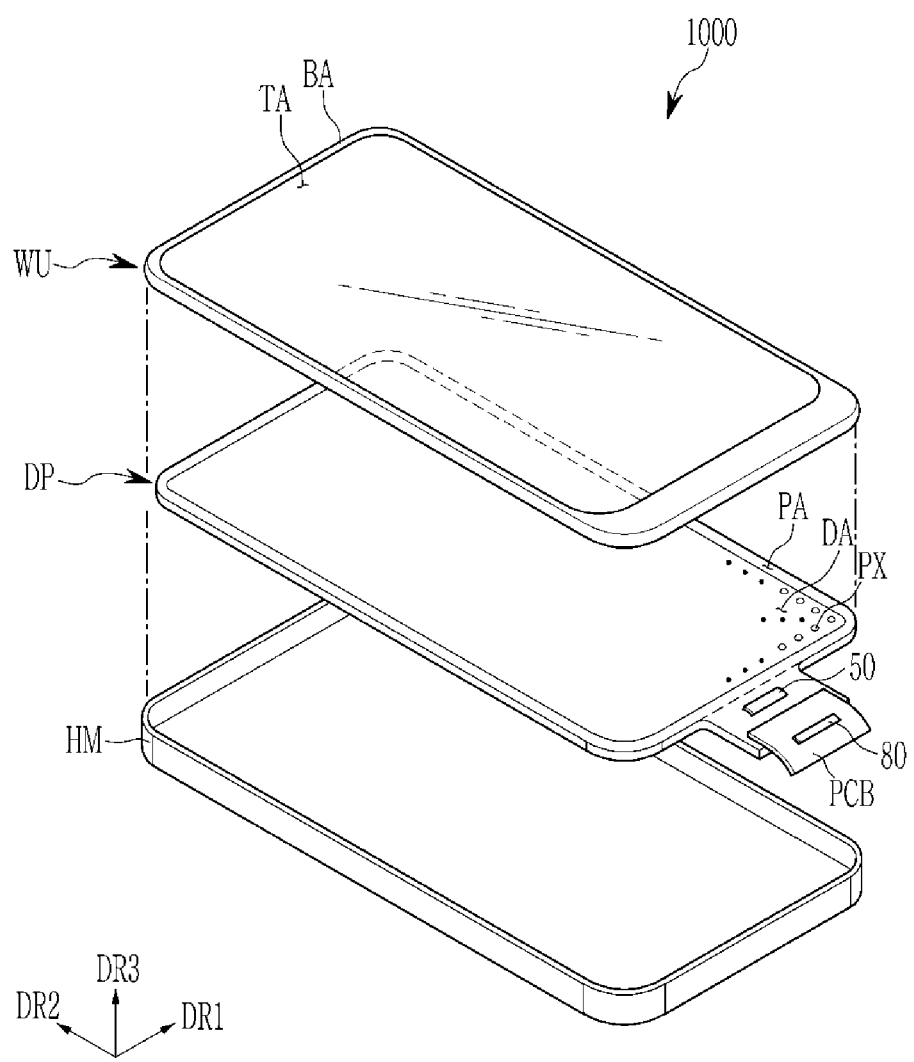
FIG. 1B illustrates an exploded perspective view of a display device according to an embodiment.
Figure 1C:
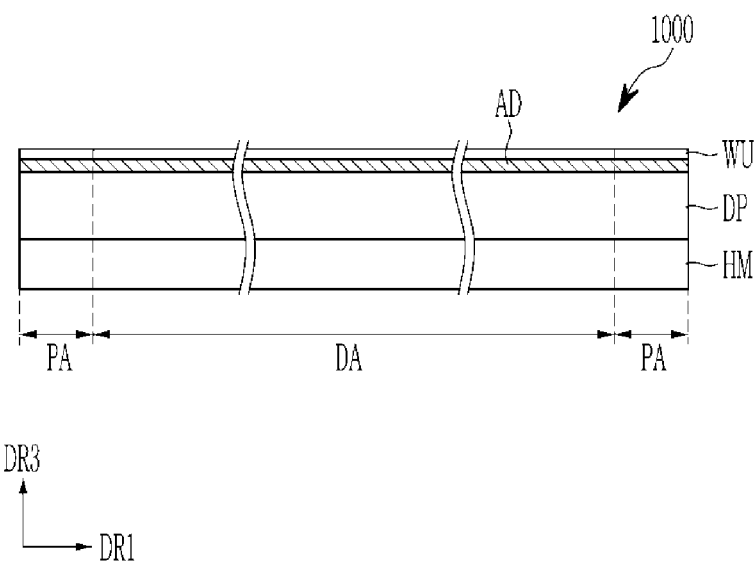
FIG. 1C illustrates a cross-sectional view of a display device according to an embodiment.

FIG. 1A illustrates a perspective view of three display devices according to an embodiment. FIG. 1B illustrates an exploded perspective view of a display device according to an embodiment. FIG. 1C illustrates a cross-sectional view of a display device according to an embodiment.

Referring to FIG. 1A, each display device 1000 may have a privacy protection function for protecting information displayed on a screen from being unwantedly viewed by surrounding people. An image may be displayed to a user who directly faces the display area of the display device 1000, and the image may not be recognized at a predetermined angle or more.

Referring to FIG. 1B, the display device 1000 may display an image in a third direction DR3 normal/perpendicular to a plane defined by a first direction DR1 and a second direction DR2. A front (or top) surface and a back (or bottom) surface of the display device 1000 may overlap each other in the third direction DR3.

The display device 1000 may display a moving image or a still image. The display device 1000 may provide a display screen of an electronic device, such as a television, a laptop computer, a monitor, a billboard, the Internet of things (TOT), etc., as well as portable electronic devices such as a mobile phone, a smart phone, a tablet personal computer, a mobile communication terminal, an electronic notebook, an e-book, a portable multimedia player (PMP), a navigation system, or an ultra-mobile PC (UMPC). The display device 1000 may be included in a wearable device such as a smart watch, a watch phone, a glasses display, or a head mounted display (HMD). The display device 1000 may provide an instrument panel of a vehicle, a center information display (CID) positioned at a center fascia or dashboard of a vehicle, a mirror display that replaces a side mirror of a vehicle, or a display positioned on a back surface of a front seat of a vehicle. The display device 1000 may represent (or may be included in) a smart phone.

The display device 1000 includes a cover window WU, a display panel DP, and a housing member HM.

The cover window WU is positioned on the display panel DP to protect the display panel DP. The cover window WU may include a polyimide window or an ultra-thin glass window.

The cover window WU may include a transmission area TA and a blocking area BA. The transmission area TA may be optically transparent and may transmit incident light. The blocking area BA may have relatively lower light transmittance than the transmission area TA. The blocking area BA defines a shape of the transmission area TA. The blocking area BA may surround the transmission area TA. The blocking area BA may show a predetermined color. The blocking area BA may overlap the non-display area PA of the display panel DP to conceal the non-display area PA.

The display panel DP may be a flat rigid display panel or a flexible display panel. The display panel may be an emissive display panel. For example, the display panel may be an organic light emitting display panel or a quantum dot light emitting display panel. An emission layer of the organic light emitting display panel may include an organic light emitting material. An emission layer of the quantum dot light emitting display panel may include a quantum dot and a quantum rod.

The display panel DP may display an image on a front surface. The front surface of the display panel DP includes a display area DA and a non-display area PA. The image is displayed in the display area DA. The non-display area PA may surround the display area DA.

The display panel DP may include a plurality of pixels PX positioned in the display area DA. The pixels PX may emit/transmit light in response to electrical signals. Lights emitted/transmitted by the pixels PX may form an image. Each pixel PX may include one or more transistors and one or more capacitors.

Signal lines may extend from the display area DA to the non-display area PA, in which a pad is positioned. A data driver 50 may be positioned in the non-display area PA. The pad may be electrically connected to a printed circuit board PCB including a driving chip 80.

As illustrated in FIG. 1C, an adhesive layer AD bonding the display panel DP and the cover window WU may be positioned between the display panel DP and the cover window WU. A touch unit may be further positioned between the display panel DP and the cover window WU. The touch unit may be positioned on the display panel DP for a touch screen function of the display device 1000. The touch unit may include touch electrodes and may be a resistive type or a capacitive type.

A housing member HM may accommodate and/or support the display panel DP. The housing member HM is coupled to the cover window WU to constitute an exterior of the display device 1000. The housing member HM may have relatively high rigidity. For example, the housing member HM may include frames and/or plates made of glass, plastic, or metal.

The housing member HM provides a predetermined accommodation space. The display panel DP may be accommodated in the accommodation space to be protected from external impact.

Figure 2A:
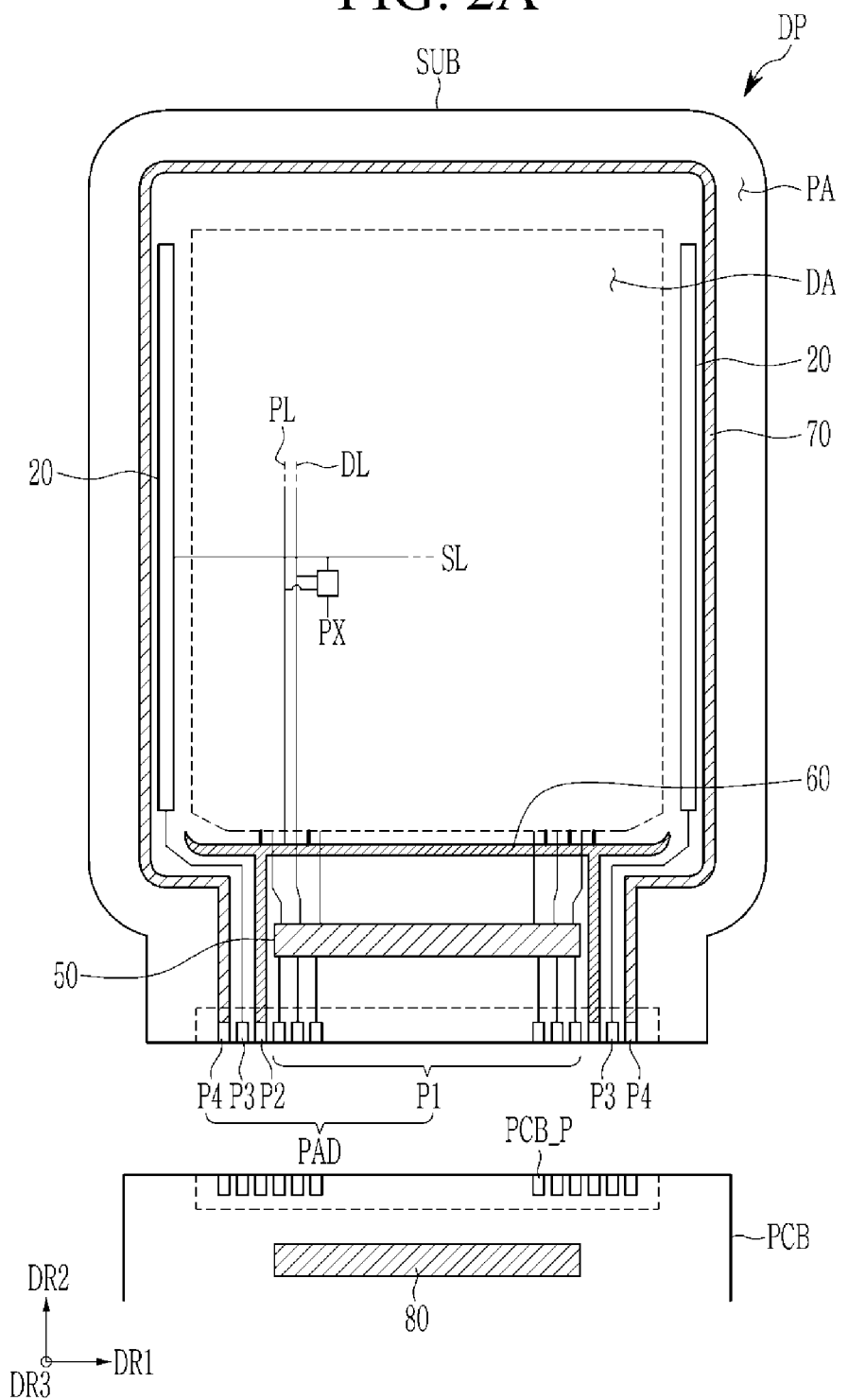
FIG. 2A illustrates a top plan view of a display panel according to an embodiment.
Figure 2B:
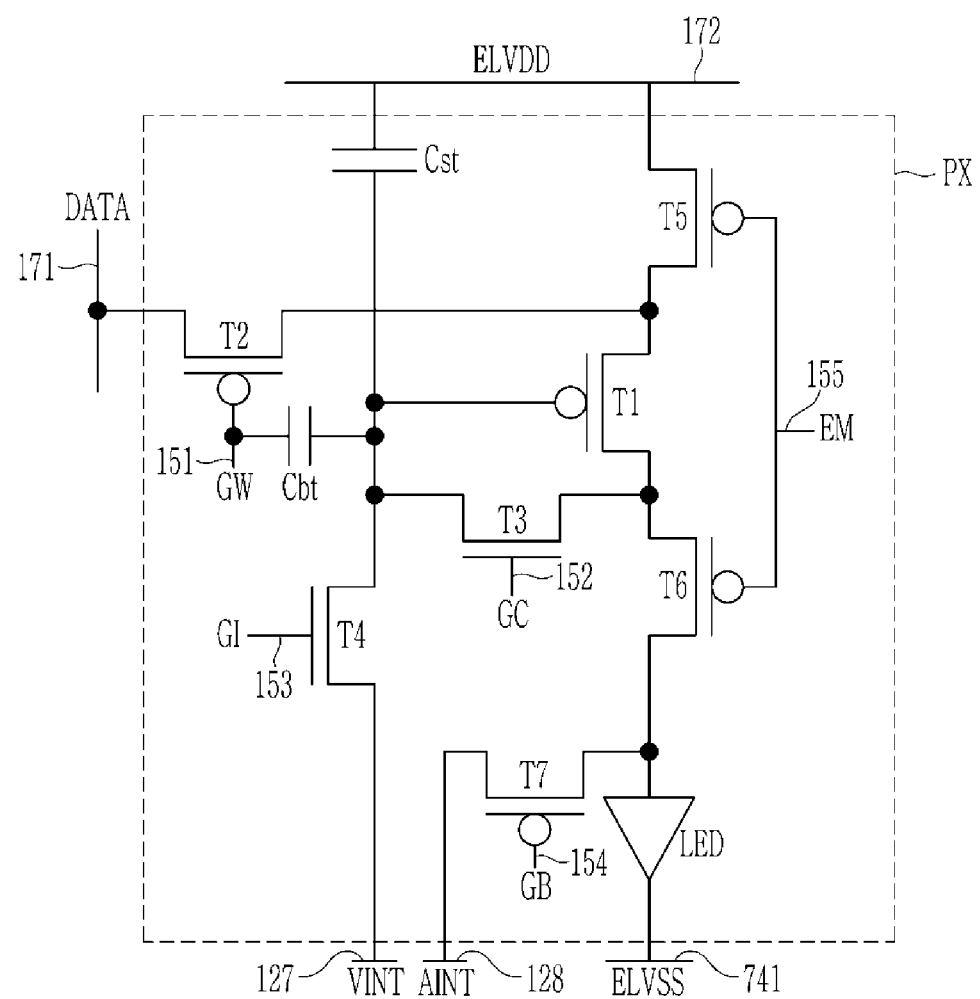
FIG. 2B illustrates a circuit diagram of a pixel according to an embodiment.

FIG. 2A illustrates a top plan view of a display panel according to an embodiment. FIG. 2B illustrates a circuit diagram of a pixel according to an embodiment.

Referring to FIG. 2A, the display panel DP includes a substrate SUB including a display area DA and a non-display area PA. The non-display area PA may surround the display area DA.

The display panel DP includes a plurality of pixels PX. The pixels PX may be positioned on the display area DA of the substrate SUB. Each of the pixels PX includes a light emitting element and a driving circuit unit connected to the light emitting element. Each of the pixels PX may emit red, green, blue, or white light, and may include an organic light emitting diode.

The display panel DP may include signal lines and a pad portion. The signal lines may include scan lines SL extending in a first direction DR1, and may include data lines DL and driving voltage lines PL extending in a second direction DR2.

A scan driver 20 may provide scan signals to pixels PX through scan lines SL. Two scan drivers 20 may be respectively disposed at left and right sides of the display area DA. One of the two scan drivers 20 may be optional.

The pad portion PAD is positioned at one end of the display panel DP, and includes terminals/pads P1, P2, P3, and P4. The pad portion PAD may be exposed by an insulating layer to be electrically connected to a printed circuit board PCB. The pad portion PAD may be electrically connected to a pad portion PCB_P of the printed circuit board PCB. The printed circuit board PCB may transfer a signal or power from an IC driving chip 80 to the pad portion PAD.

Image signals received from an external source are converted into image data signals, and the image data signals are transferred to the data driver 50 through the terminals P1. Control signals for controlling the scan driver 20 and the data driver 50 may be provided through the terminals P3 and P1. A driving voltage ELVDD is transferred to a driving voltage supply line 60 through the terminal P2. A common voltage ELVSS is transferred to each of common voltage supply wires 70 through the terminals P4.

The data driver 50 is disposed on the non-display area PA and may provide data signals to the pixels PX. The data driver 50 may be disposed at a side of the display panel DP, for example, between the pad portion PAD and the display area DA.

A driving voltage supply line 60 is positioned on the non-display area PA. The driving voltage supply line 60 may be positioned between the data driver 50 and the display area DA. The driving voltage supply line 60 provides the driving voltage ELVDD to the pixels PX. The driving voltage supply line 60 extends lengthwise in the first direction DR1, and may be connected to a plurality of driving voltage lines PL extending in the second direction DR2.

A common voltage supply line 70 is positioned on the non-display area PA. The common voltage supply line 70 may substantially surround the display area DA. The common voltage supply line 70 transfers the common voltage ELVSS to the common electrode (e.g., second electrode) shared by pixels PX.

As illustrated in FIG. 2B, one pixel PX of the display device includes transistors T1, T2, T3, T4, T5, T6, and T7, a storage capacitor Cst, a boost capacitor Cbt, and a light emitting diode LED connected to wires 127, 128, 151, 152, 153, 154, 155, 171, 172, and 741.

The wires 127, 128, 151, 152, 153, 154, 155, 171, 172, and 741 are connected to one pixel PX. The wires include a first initialization voltage line 127, a second initialization voltage line 128, a first scan signal line 151, a second scan signal line 152, an initialization control line 153, a bypass control line 154, a bypass control line 155, a data line 171, a driving voltage line 172, and a common voltage line 741.

The first scan signal line 151 is connected to a gate driver 20 (illustrated in FIG. 2A) to transmit a first scan signal GW to the second transistor T2. A voltage having a polarity that is opposite to that of the voltage applied to the first scan signal line 151 may be applied to the second scan signal line 152 at a same timing as a signal of the first scan signal line 151. When a negative voltage is applied to the first scan signal line 151, a positive voltage may be applied to the second scan signal line 152. The second scan signal line 152 transmits a second scan signal GC to the third transistor T3.

The initialization control line 153 transmits an initialization control signal GI to the fourth transistor T4. The bypass control line 154 transfers a bypass signal GB to the seventh transistor T7. The bypass control line 154 may be formed by a previous-stage first scan signal line 151. The emission control line 155 transmits an emission control signal EM to the fifth transistor T5 and the sixth transistor T6.

The data line 171 is a wire for transmitting a data voltage DATA generated by a data driver (not illustrated), and luminance of the organic light emitting diode LED that emits light is changed depending on the data voltage DATA applied to the pixel PX.

The driving voltage line 172 applies a driving voltage ELVDD. The first initialization voltage line 127 transfers a first initialization voltage VINT, and the second initialization voltage line 128 transfers the second initialization voltage AINT. The common voltage line 741 applies a common voltage ELVSS to a cathode of the light emitting diode LED. In the present embodiment, voltages applied to the driving voltage line 172, the first and second initialization voltage lines 127 and 128, and the common voltage line 741 may be constant voltages, respectively.

The transistors may include a driving transistor T1, a second transistor T2, a third transistor T3, a fourth transistor T4, a fifth transistor T5, a sixth transistor T6, and a seventh transistor T7. The transistors may include an oxide transistor including an oxide semiconductor and a silicon transistor including a polycrystalline silicon semiconductor. The third transistor T3 and the fourth transistor T4 may be oxide transistors, and the driving transistor T1, the second transistor T2, the fifth transistor T5, the sixth transistor T6, and the seventh transistor T7 may be silicon transistors. The transistors may all be silicon transistors. The third transistor T3, the fourth transistor T4, and the seventh transistor T7 may be oxide transistors; the driving transistor T1, the second transistor T2, the fifth transistor T5, and the sixth transistor T6 may be silicon transistors.

The number of transistors, the number of capacitors, and their connection relationships may be configured differently.

Figure 3:
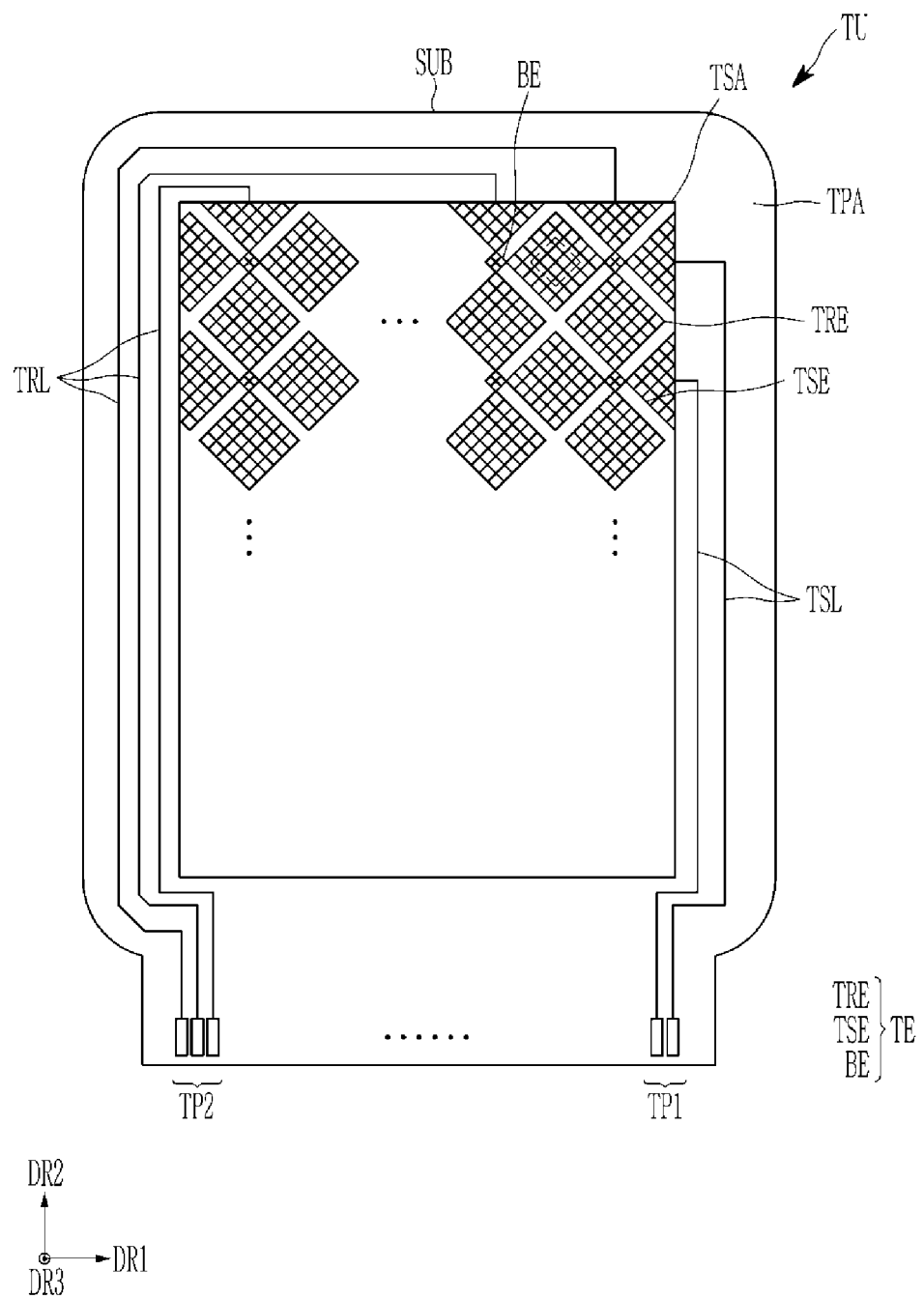
FIG. 3 illustrates a top plan view showing a touch electrode and a touch wire according to an embodiment.

FIG. 3 illustrates a top plan view showing a touch sensing unit including a touch electrode and a touch wire according to an embodiment.

Referring to FIG. 3, the touch sensing unit TU includes a touch sensing area TSA for sensing a user touch and includes a touch peripheral area TPA positioned around the touch sensing area TSA. The touch sensing area TSA may overlap the display area DA of the display panel DP, and the touch peripheral area TPA may overlap the non-display area PA of the display panel DP.

Touch electrodes TE may be positioned in the touch sensing area TSA. The touch electrodes TE may include sensing electrodes TSE electrically connected in the first direction DR1 and may include driving electrodes TRE electrically connected in the second direction DR2. The sensing electrodes TSE and the driving electrodes TRE may have a quadrilateral, rhombus, and/or square shape in a plan view. The touch electrodes TE may have a mesh structure as illustrated in FIG. 3.

The driving electrodes TRE adjacent to each other in the second direction DR2 may be electrically connected to each other through a bridge electrode BE in order to prevent the sensing electrodes TSE and the driving electrodes TRE from short circuiting each other in their crossing regions. The driving electrodes TRE and the sensing electrodes TSE may be positioned directly on one insulating layer, and the bridge electrode BE may be positioned directly on a different insulating layer.

Touch lines TSL and TRL may be positioned in the touch peripheral area TPA. The touch lines TSL and TRL may include sensing lines TSL connected to the sensing electrodes TSE and may include driving lines TRL connected to the driving electrodes TRE. The sensing line TSL may be connected to a first touch pads TP1, and the driving line TRL may be connected to a second touch pads TP2.

The touch electrodes TE may be driven by a mutual capacitance method or a self-capacitance method.

Figure 4B:
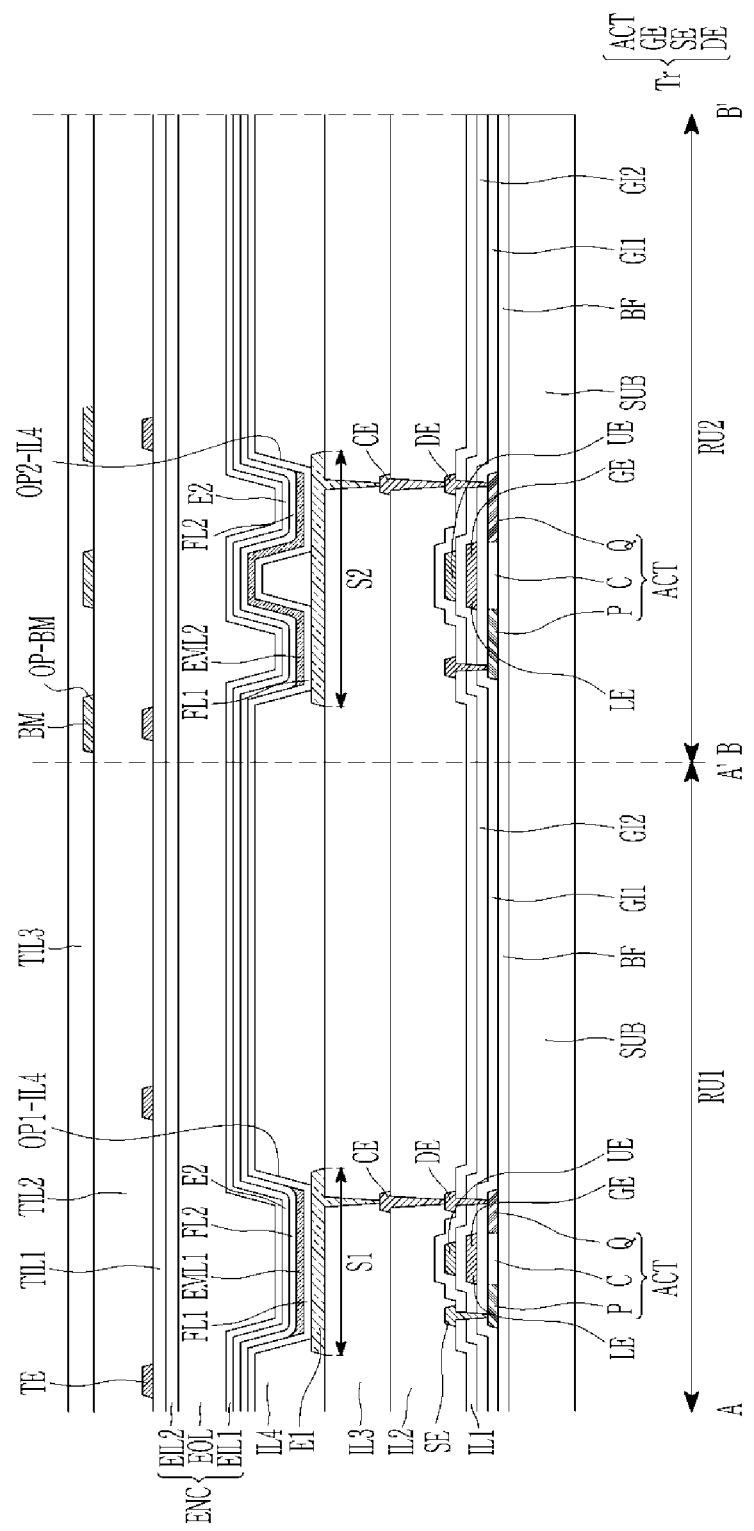
FIG. 4B illustrates a cross-sectional view showing a first pixel unit and a second pixel unit according to an embodiment.
Figure 4C:
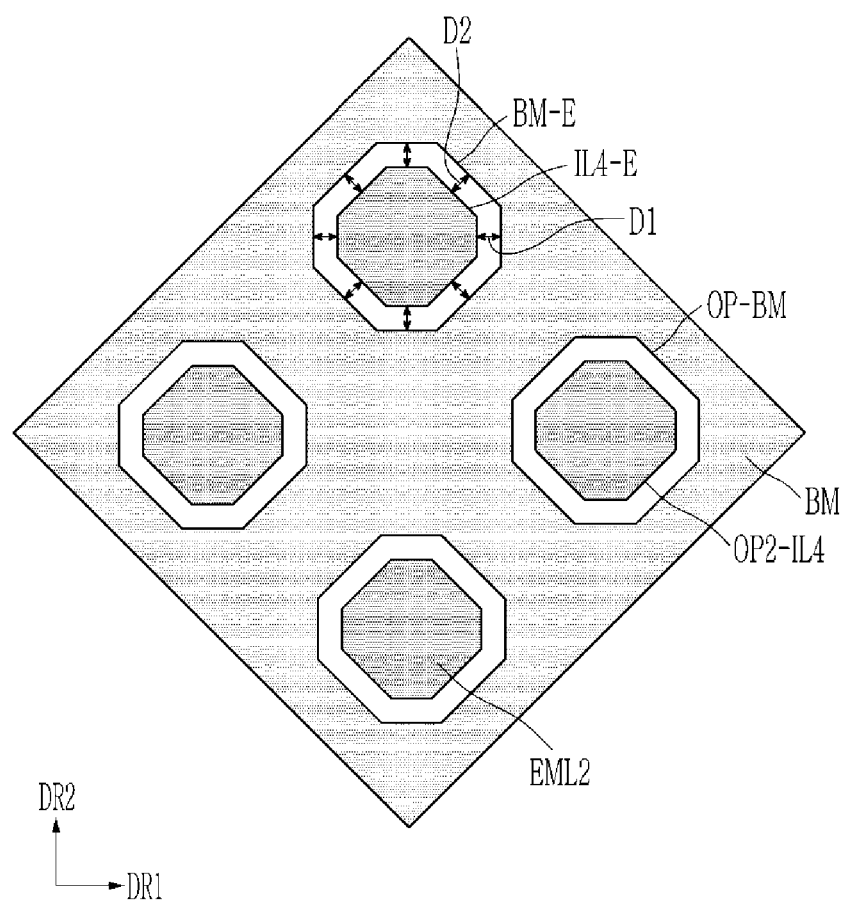
FIG. 4C illustrates a plan view showing a portion of a second pixel unit according to an embodiment.
Figure 4D:
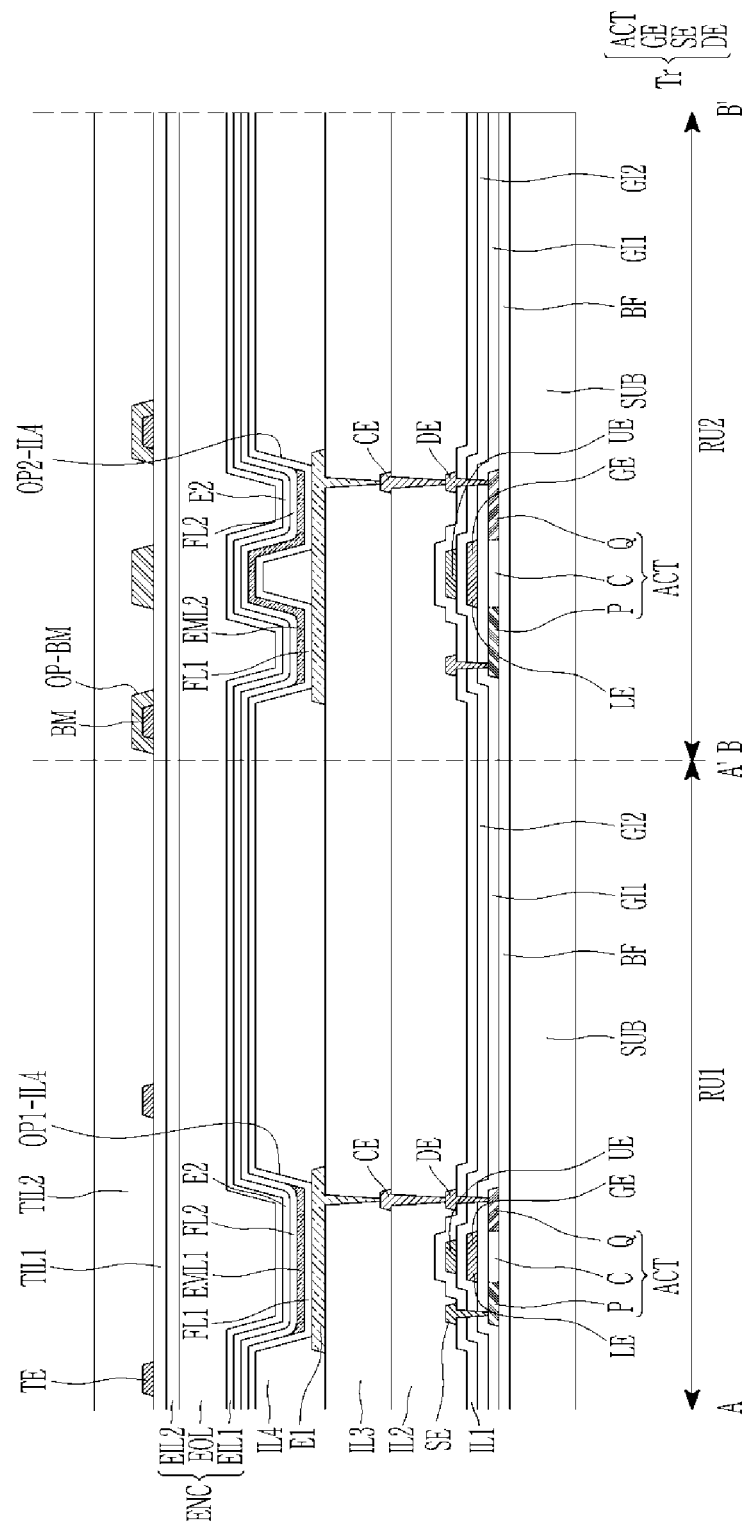
FIG. 4D illustrates a cross-sectional view showing a first pixel unit and a second pixel unit according to an embodiment.

FIG. 4A illustrates a top plan view showing a first pixel unit and a second pixel unit according to an embodiment. FIG. 4B illustrates a cross-sectional view showing a first pixel unit and a second pixel unit according to an embodiment. FIG. 4C illustrates a plan view of a second pixel unit. FIG. 4D illustrates a cross-sectional view showing a first pixel unit and a second pixel unit according to an embodiment.

Referring to FIG. 4A, copies/instances of a first pixel unit RU1 and a second pixel unit RU2 may be consecutively positioned on a substrate. Instances of the first pixel unit RU1 and instances of the second pixel unit RU2 may be alternately positioned. The first pixel unit RU1 and the second pixel unit RU2 may include components stacked on the substrate SUB. Each of the first pixel unit RU1 and the second pixel unit RU2 may include one or more pixels PX.

The first pixel unit RU1 may include a first color pixel R, a second color pixel G, and a third color pixel B. The first color may be red, the second color may be green, and the third color may be blue.

One first color pixel R, two second color pixels G, and two third color pixels B may form one first pixel unit RU1. A white color may be expressed by the first pixel unit RU1.

In the display panel, a number of first color pixels R and a number of third color pixels B may be the same. In the display panel, a number of second color pixels G may be twice the number of first color pixels R, i.e., twice the number of third color pixels B. In the display panel, the number of second color pixels G may be equal to a sum of the number of first color pixels R and the number of third color pixels B.

As illustrated in FIG. 4A, each of the first color pixel R, the second color pixel G, and the third color pixel B may have a polygonal shape in a plan view. Each of the first color pixel R, the second color pixel G, and the third color pixel B may have a shape of a quadrangle, an octagon, a rhombus), a circle, and/or an oval in a plan view. Shapes of the first color pixel R, the second color pixel G, and the third color pixel B may be identical to, similar to, and/or different from each other.

FIG. 4A illustrates that sizes of the first color pixel R and the third color pixel B are the same in a plan view. In a plan view, sizes of the first color pixel R, the second color pixel G, and the third color pixel B may be different from each other. For example, in a plan view, the size of the first color pixel R may be greater than that of the second color pixel G, and the size of the third color pixel B may be greater than that of the second color pixel G. In a plan view, the size of the first color pixel R may be substantially the same as that of the third color pixel B or smaller than that of the third color pixel B.

The touch electrodes TE may have mesh structures, and the first to third color pixels R, G, and B may be positioned in openings of the mesh structures. Accordingly, it is possible to prevent emission areas of the first to third color pixels R, G, and B from being reduced for the touch electrodes TE.

Referring to FIG. 4B, the substrate SUB may include an inorganic insulating material such as glass, and/or an organic insulating material such as plastic, e.g., a polyimide (PI). The substrate SUB may be a single layer or a multilayer structure. The substrate SUB may have at least one polymer resin layer and at least one inorganic layer which are alternately stacked.

The substrate SUB may be a rigid substrate or a flexible substrate capable of bending, folding, and/or rolling.

A buffer layer BF may be disposed on the substrate SUB. The buffer layer BF may prevent impurities from being transferred from the substrate SUB to an upper layer of the buffer layer BF, particularly a semiconductor layer ACT, thereby preventing deterioration of the semiconductor layer ACT. The buffer layer BF may include an inorganic insulating material such as a silicon nitride or a silicon oxide, or may include an organic insulating material. A portion or an entire portion of the buffer layer BF may be optional.

The semiconductor layer ACT is disposed on the buffer layer BF. The semiconductor layer ACT may include at least one of polysilicon and an oxide semiconductor. The semiconductor layer ACT includes a channel region C, a first region P, and a second region Q. The first region P and the second region Q are disposed at opposite sides of the channel region C, respectively. The channel region C may be doped with a small amount of impurities or may not be doped with impurities, and the first region P and the second region Q may be doped with a larger amount of impurities than the channel region C. The semiconductor layer ACT may be formed of an oxide semiconductor, and a protective layer (not illustrated) may be added to protect the oxide semiconductor material, which may be vulnerable to high temperatures.

A first gate insulating layer GI1 may be disposed on the semiconductor layer ACT.

A gate electrode GE and a lower electrode LE are positioned on the first gate insulating layer GI1. The gate electrode GE and the lower electrode LE may be integrally formed. The gate electrode GE and the electrode GE may be a single layer or a multilayer in which a metal films one of two or more of copper (Cu), a copper alloy, aluminum (Al), an aluminum alloy, molybdenum (Mo), a molybdenum alloy, titanium (Ti), and a titanium alloy are stacked. The gate electrode GE may overlap the channel region C of the semiconductor layer ACT.

The second gate insulating layer GI2 may be positioned on the gate electrode GE and the first gate insulating layer GI1. The first gate insulating layer GI1 and the second gate insulating layer GI2 may be a single layer or multiple layers including at least one of a silicon oxide ($SiO_x$), a silicon nitride ($SiN_x$), and a silicon oxynitride ($SiO_xN_y$).

An upper electrode UE may be positioned on the second gate insulating layer GI2. The upper electrode UE and the lower electrode LE may form a storage capacitor.

A first insulating layer IL1 is disposed on the upper electrode UE. The first insulating layer IL1 may be a single layer or multiple layers including at least one of a silicon oxide ($SiO_x$), a silicon nitride ($SiN_x$), and a silicon oxynitride ($SiO_xN_y$).

A source electrode SE and a drain electrode DE are positioned on the first insulating layer IL1. The source electrode SE and the drain electrode DE are respectively connected to the first region P and the second region Q of the semiconductor layer ACT through contact holes formed in the insulating layers.

The source electrode SE and the drain electrode DE may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu) and may have a single layer structure or a multilayer structure.

A first insulating layer IL1 and a second insulating layer IL2 are positioned on the source electrode SE and the drain electrode DE. The second insulating layer IL2 may include at least one of a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

A connection electrode CE is positioned on the second insulating layer IL2. A third insulating layer IL3 may be positioned on the connection electrode CE. A first electrode E1 may be positioned on the third insulating layer IL3. The first electrode E1 may be connected to the connection electrode CE through a contact hole of the third insulating layer IL3, and may be electrically connected to the drain electrode DE.

The first electrode E1 may include a metal such as silver (Ag), lithium (Li), calcium (Ca), aluminum (Al), magnesium (Mg), and/or gold (Au), and may also include a transparent conductive oxide (TCO) such as indium zinc oxide (IZO) and/or indium tin oxide (ITO). The first electrode E1 may be a single layer including a metal material or a transparent conductive oxide, or a multilayer. The first electrode E1 may have a triple layer structure of indium tin oxide (ITO)-silver (Ag)-indium tin oxide (ITO).

A transistor including the gate electrode GE, the semiconductor layer ACT, the source electrode SE, and the drain electrode DE is connected to the first electrode E1 to control the supply of a current to a light emitting element.

A partition wall IL4 (or wall layer IL4) is positioned on the second insulating layer IL2 and the first electrode E1 and includes partitions/walls that separate openings. Although not illustrated, a spacer may be positioned on the partition wall IL4.

The partition wall IL4 has a first partition wall opening OP1-IL4 (or hole OP1-IL4) overlapping at least a portion of the first electrode E1 and defining an emission area. The first partition wall opening OP1-IL4 may have a planar shape that is substantially similar to that of the first electrode E1. The first partition opening OP1-IL4 may have a shape of an octagon approximating a rhombus, a rhombus, a quadrangle, a polygon, or a circle in a plan view.

The partition wall IL4 and the spacer may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, and/or a siloxane polymer. The partition wall IL4 may include an inorganic insulating material such as a silicon nitride, a silicon oxynitride, or a silicon oxide. The partition wall IL4 may include an organic insulator and/or an inorganic insulator. The partition wall IL4 includes a light blocking material, and may be black. The light-blocking material may include carbon black, carbon nanotubes, a resin or paste containing a black dye, metal particles such as nickel, aluminum, molybdenum, and/or an alloy, metal oxide particles (e.g., chromium oxide), and/or metal nitride particles (e.g., chromium nitride). When the partition wall IL4 includes a light blocking material, reflection of external light by metal structures positioned under a pixel defining layer IL7 may be reduced.

A first emission layer EML1 is positioned on the first electrode E1 overlapping the first partition wall opening OP1-IL4. The first emission layer EML1 may include an organic material and/or an inorganic material. The first emission layer EML1 may generate a predetermined color light. The first emission layer EML1 may be positioned within the first partition opening OP1-IL4 using a mask.

The partition wall IL4 included in the first pixel unit RU1 may include one first partition wall opening OP1-IL4. The first emission layer EML1 may be exposed through one first partition wall opening OP1-IL4. The first pixel unit RU1 may include one emission area corresponding to one emission layer EML1.

Functional layers FL1 and FL2 may be positioned above and below the first emission layer EML1. The first functional layer FL1 includes at least one of a hole injection layer HIL and a hole transport layer HTL, and the second functional layer FL2 may be a multilayer including at least one of an electron transport layer ETL and an electron injection layer EIL. The functional layers FL1 and FL2 may substantially overlap an entire surface of the substrate SUB.

The second electrode E2 is positioned on the functional layers FL1 and FL2. The second electrode E2 may include a reflective metal including calcium (Ca), barium (Ba), magnesium (Mg), aluminum (Al), silver (Ag), gold (Au), nickel (Ni), chromium (Cr), lithium (Li), and/or calcium (Ca), and/or a transparent conductive oxide (TCO) such as indium tin oxide (ITO) or indium zinc oxide (IZO).

The first electrode E1, the first emission layer EML1, (portions of) the functional layers FL1 and FL2, and (a portion of) the second electrode E2 may constitute a light emitting element. The first electrode E1 may be an anode which is a hole injection electrode, and the second electrode E2 may be a cathode which is an electron injection electrode. The first electrode E1 may be a cathode, and the second electrode E2 may be an anode.

When holes and electrons are injected from the first electrode E1 and the second electrode E2 into the first emission layer EML1, excitons formed by combining the injected holes and electrons are emitted when they fall from an excited state to a ground state.

An encapsulation layer ENC may be disposed on the second electrode E2. The encapsulation layer ENC may cover and seal the upper surface and side surfaces of the light emitting element. The encapsulation layer ENC seals the light emitting element to block inflow of moisture and oxygen.

The encapsulation layer ENC may be a composite film including an inorganic layer and an organic layer. The encapsulation layer ENC may include a first inorganic encapsulation layer EIL1, an encapsulation organic layer EOL, and a second inorganic encapsulation layer EIL2 that are sequentially formed.

The first encapsulation inorganic layer EIL1 may cover the second electrode E2. The first encapsulation inorganic layer EIL1 may prevent external moisture or oxygen from penetrating into the light emitting element. The first encapsulation inorganic layer EIL1 may include at least one of a silicon nitride, a silicon oxide, and a silicon oxynitride. The first encapsulation inorganic layer EIL1 may be formed through a deposition process.

The encapsulation organic layer EOL may be disposed on the first encapsulation inorganic layer EIL1 and may contact the first encapsulation inorganic layer EIL1. Curves formed on an upper surface of the first encapsulation inorganic layer EIL1 or particles present on the first encapsulation inorganic layer EIL1 may be covered and flattened by the encapsulation organic layer EOL. The encapsulation organic layer EOL may relieve stress between layers that contact the encapsulation organic layer EOL. The encapsulation organic layer EOL may include an organic material, and may be formed through a solution process such as spin coating, slit coating, or an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface than that of the first encapsulation inorganic layer EIL1. The second encapsulation inorganic layer EIL2 may block moisture. The second encapsulation inorganic layer EIL2 may include at least one of a silicon nitride, a silicon oxide, a silicon oxynitride. The second encapsulation inorganic layer EIL2 may be formed through a deposition process.

Although not illustrated, a capping layer positioned between the second electrode E2 and the encapsulation layer ENC may be further included. The capping layer may include an organic material. The capping layer protects the second electrode E2 from a subsequent process, e.g., a sputtering process, and improves light output efficiency of the light emitting element. The capping layer may have a refractive index that is greater than that of the first encapsulation inorganic layer EIL1.

A first touch insulating layer TIL1, a touch electrode TE, a first overcoat layer TIL2, and a second overcoat layer TIL2 may be positioned on the encapsulation layer ENC.

The first touch insulating layer TIL1 may include at least one of an inorganic layer and an organic layer. The inorganic layer may include at least one of a silicon oxide, a silicon nitride, and a silicon oxynitride. The organic layer may include a polymer-based material. The first encapsulation inorganic layer EIL1, the second encapsulation inorganic layer EIL2, and the first touch insulating layer TIL1 may be formed of a same material, e.g., a same inorganic material.

A touch electrode TE may be positioned on the first touch insulating layer TIL1. The touch electrode TE may be a section of the aforementioned sensing electrode TSE or driving electrode TRE.

A first overcoat layer TIL2 may be positioned on the first touch insulating layer TIL1 and the touch electrode TE. The first overcoat layer TIL2 may substantially overlap an entire surface of the substrate SUB. The first overcoat layer TIL2 may include at least one of an acrylic resin, a polyimide resin, a polyamide resin, and Alq$_3$ [Tris(8-hydroxyquinolinato)aluminum].

A second overcoat layer TIL3 may be disposed on the first overcoat layer TIL2. The second overcoat layer TIL3 may substantially overlap the entire surface of the substrate SUB. The second overcoat layer TIL3 may further include dispersed particles. The second overcoat layer TIL3 may include metal oxide particles such as zinc oxide (ZnO), titanium oxide (TiO$_2$), or zirconium oxide (ZrO$_2$).

No additional light blocking member may be positioned between the first overcoat layer TIL1 and the second overcoat layer TIL2 in the first pixel unit RU1.

Some structures of the second pixel unit RU2 may be identical to or analogous to some structures of the first pixel unit RU1.

Referring to FIG. 4A, the second pixel unit RU2 may include a first color pixel R, a second color pixel G, and a third color pixel B. The first color may be red, the second color may be green, and the third color may be blue. A white color may be expressed using the second pixel unit RU2.

Each of the first color pixel R, the second color pixel G, and the third color pixel B may include emission areas separated by the partition wall IL4 and the light blocking member BM. For example, each of the first color pixel R, the second color pixel G, and the third color pixel B may include four emission areas separated by the partition wall IL4 and the light blocking member BM. The divided emission areas may separately provide light emitted from one light emitting layer.

Referring to FIG. 4B, the second pixel unit RU2 may include a first electrode E1. A size S2 of the first electrode E1 included in the second pixel unit RU2 may be larger than a size S1 of the first electrode E1 included in the first pixel unit RU1. In the second pixel unit RU2, light emitted from a second emission layer EML2 may be partially blocked by the light blocking member BM. The size S2 of the first electrode E1 included in the second pixel unit RU2 may be larger than the size S1 of the first electrode E1 included in the first pixel unit RU1 in order to substantially equally provide an amount of light emitted from the first pixel unit RU1 and an amount of light emitted from the second pixel unit RU2.

The partition wall IL4 may be positioned on the first electrode E1. The partition wall IL4 included in the second pixel unit RU2 may include a second partition wall opening OP2-IL4 (or hole OP2-IL4). The second partition wall opening OP2-IL4 may overlap the second emission layer EML2. The partition wall IL4 may include at least two second partition wall openings OP2-IL4 overlapping the second emission layer EML2. A number of emission areas formed from one second light emitting layer EML2 may be determined depending on the number of the second partition wall openings OP2-IL4. As an example, the partition wall IL4 has four second partition wall openings OP2-IL4 overlapping one second light emitting layer EML2.

The second emission layer EML2 may be positioned on a section of the partition wall IL4 and the first electrode E1. The second emission layer EML2 may be positioned in the second partition wall opening OP2-IL4, and may cover side surfaces and an upper surface of the section of the partition wall IL4 positioned between the adjacent second partition wall openings OP2-IL4. The second emission layer EML2 may overlap the second partition wall openings OP2-IL4. The second emission layer EML2 may have a shape that is substantially similar to a planar shape of the first electrode E1 in a plan view of the display device.

The first functional layer FL1 and the second functional layer FL2 may be positioned between the first electrode E1 and the second emission layer EML2 and between the second emission layer EML2 and the second electrode E2. The encapsulation layer ENC, the first touch insulating layer TIL1, the touch electrode TE, and the first overcoat layer TIL2 may be sequentially disposed on the second electrode E2.

The light blocking member BM may be positioned on the first overcoat layer TIL2. The light blocking member BM may overlap the touch electrode TE. The light blocking member BM may overlap the partition wall IL4.

The light blocking member BM included in the second pixel unit RU2 may include light transmitting openings OP-BM (e.g., holes). The light transmitting openings OP-BM may overlap portions of the second emission layer EML2. A portion of the light blocking member BM positioned between the light transmitting openings OP-BM may overlap the second emission layer EML2. The second emission layer EML2 may be partially exposed by the light transmitting openings OP-BM, and light emitted by the second emission layer EML2 may be transmitted through light transmitting openings OP-BM.

The light transmitting openings OP-BM may overlap the second partition wall openings OP2-IL4.

As illustrated in FIG. 4C, planar shapes of the light transmitting openings OP-BM and the second partition wall openings OP2-IL4 may be similar. The planar shapes of the light transmitting openings OP-BM and the second partition wall openings OP2-IL4 may be octagonal. Each light transmitting opening OP-BM may be larger than each second partition wall opening OP2-IL4 in a plan view of the display device. Each second partition wall opening OP2-IL4 may be positioned within a corresponding light transmitting opening OP-BM in a plan view of the display device.

An edge/perimeter BM-E of the light blocking member BM included in the second pixel unit RU2 and an edge/perimeter IL4-E of the partition wall IL4 included in the second pixel unit RU2 may be spaced apart from each other and parallel to each other. In a plan view, a first distance D1 between a first section of the edge BM-E of the light blocking member BM and a corresponding first section of the edge IL4-E of the partition wall IL4 in the first direction DR1 (transverse direction) may be substantially equal to a second distance D2 between a second section of the edge BM-E of the light blocking member BM and a corresponding second section of the edge IL4-E of the partition wall IL4 in a diagonal direction inclined by 45 degrees with respect to the first direction. Each of the first distance D1 and the second distance may be in a range of 0.5 to 1.5 micrometers.

The second overcoat layer TIL3 may be disposed on the light blocking member BM, as illustrated in FIG. 4B.

The display device may include the light blocking member BM positioned on the touch electrode TE and partially overlapping the second emission layer EML2 to optimize a privacy protection mode. Luminance recognized from a line of sight not perpendicular to the display surface may be reduced substantially.

FIG. 4D illustrates a cross-sectional view of a display panel according to an embodiment. Some structures illustrated in FIG. 4D may be identical to or analogous to some structures described with reference to FIG. 4B.

Referring to FIG. 4D, the display device may include the first touch insulating layer TIL1 positioned on the encapsulation layer ENC, the touch electrode TE positioned on the first touch insulating layer TIL1, and the first overcoat layer TIL2 positioned on the touch electrode TE. The light blocking member BM may be positioned between the touch electrode TE and the first overcoat layer TIL2. The light blocking member BM may cover the touch electrode TE, and may directly contact (at least three consecutive flat faces of) the touch electrode TE. The second overcoat layer TIL3 described with reference to FIG. 4B may be optional. Without the second overcoat layer TIL3, a manufacturing process may be simplified.

Figure 5:
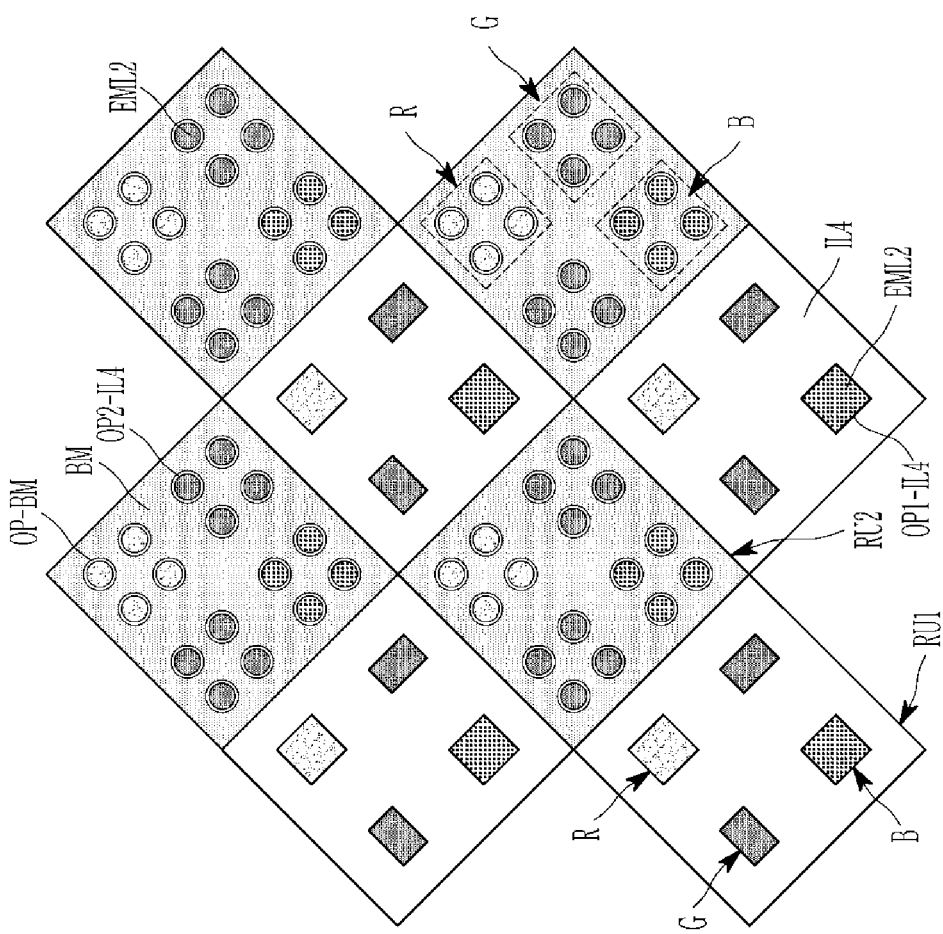
FIG. 5 illustrates a top plan view showing a first pixel unit and a second pixel unit according to an embodiment.

FIG. 5 illustrates a top plan view of a display panel according to an embodiment. Some structures of the display panel may be identical to or analogous to some structures described above.

The second pixel unit RU2 may include the light blocking member BM including the light transmitting openings/holes OP-BM. A planar shape of each light transmitting opening OP-BM may be circular.

The partition wall IL4 included in the second pixel unit RU2 may include the second partition wall openings OP2-IL4. A planar shape of each second partition wall opening OP2-IL4 may be circular.

Each opening OP-BM may be concentric with a corresponding opening OP2-IL4. A distance from the edge/perimeter of an opening OP-BM to the edge of the corresponding opening OP2-IL4 may be constant in all directions.

The display device may include the light blocking member BM positioned on the touch electrode TE to optimize a privacy protection mode. Luminance recognized from a line of sight not perpendicular to the display surface may be reduced.

Figure 6A:
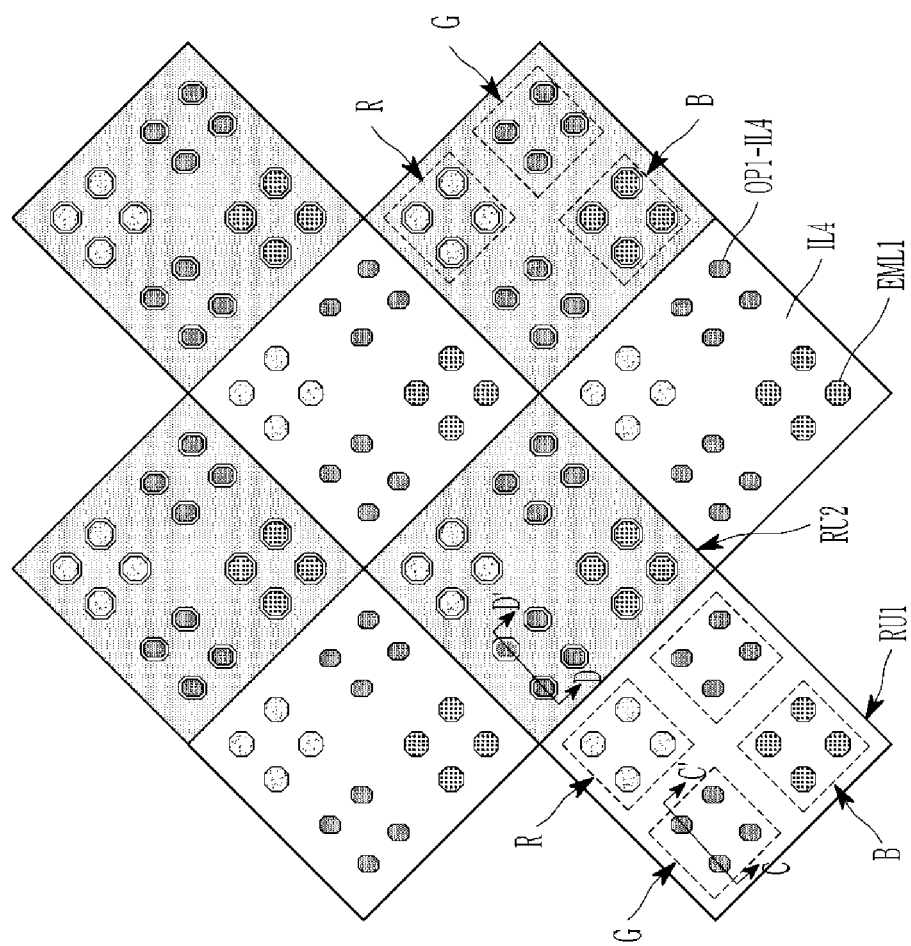
FIG. 6A illustrates a top plan view showing a first pixel unit and a second pixel unit according to an embodiment.
Figure 6B:
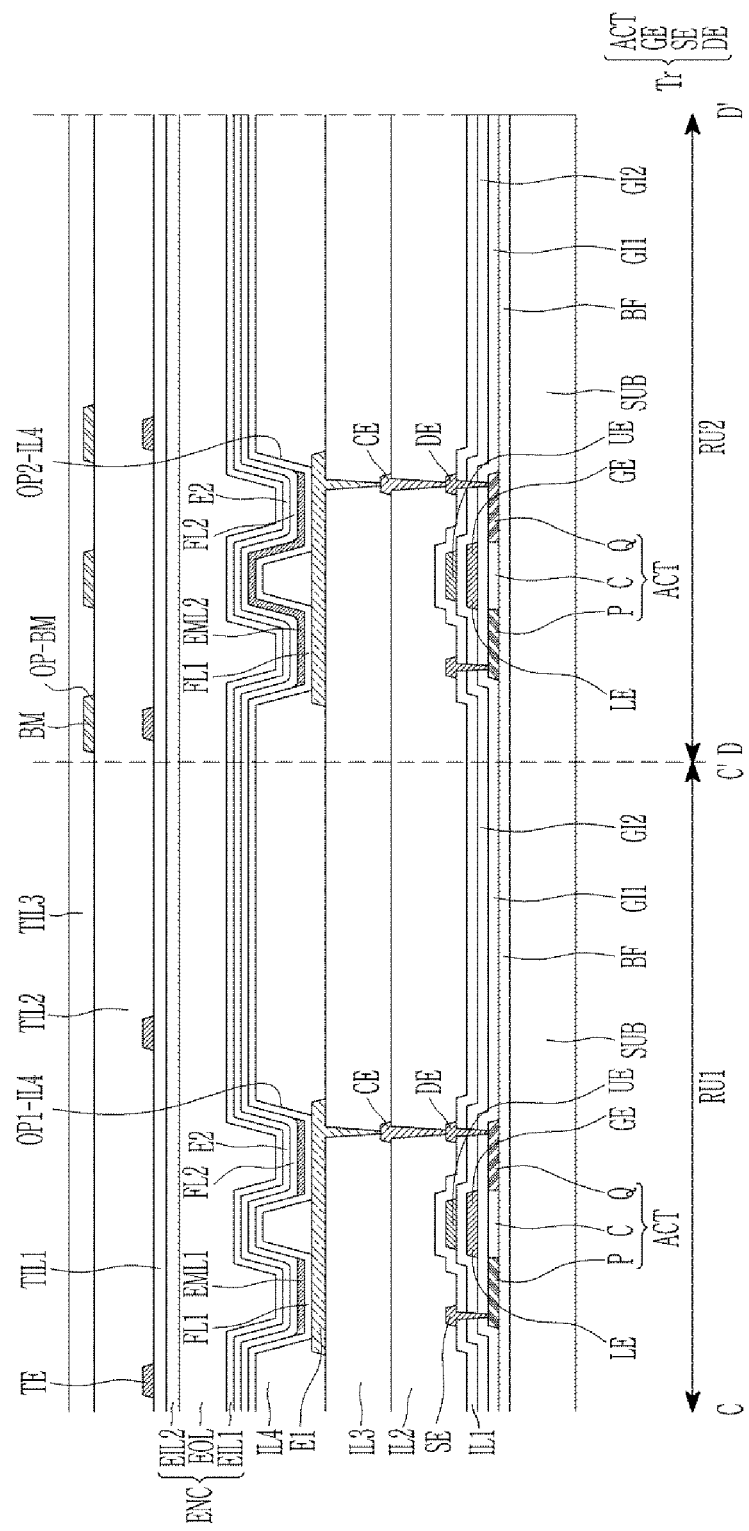
FIG. 6B illustrates a cross-sectional view showing a first pixel unit and a second pixel unit according to an embodiment.
Figure 7:
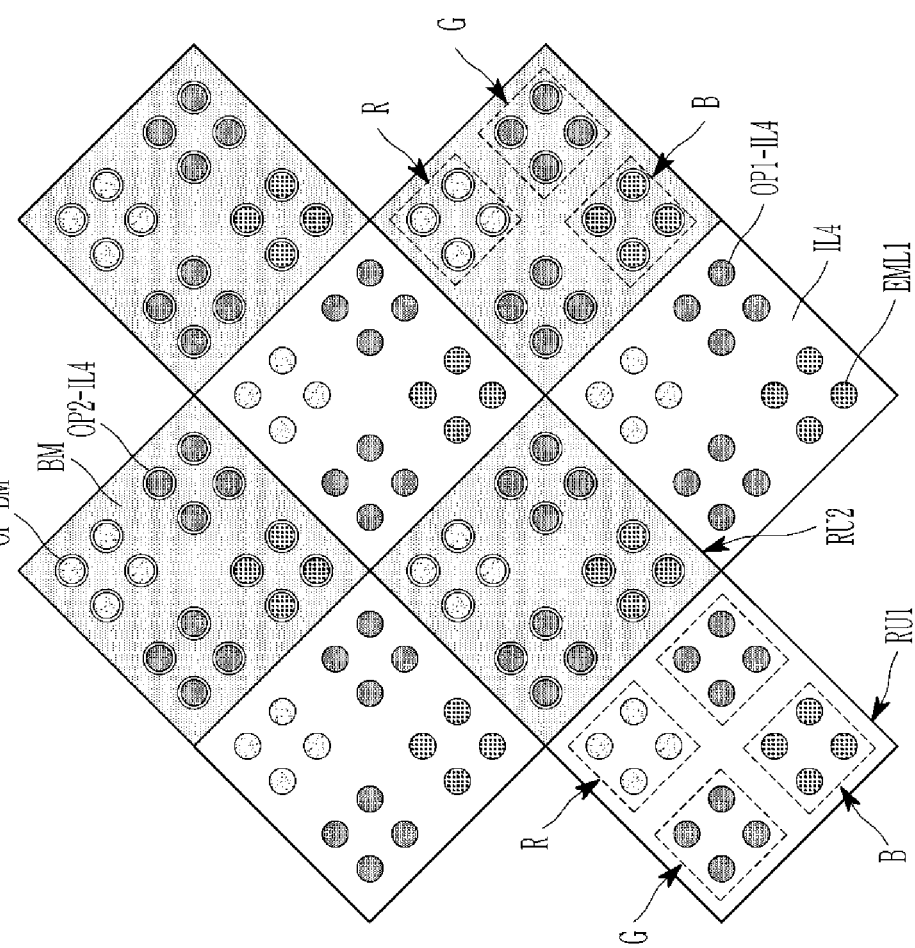
FIG. 7 illustrates a top plan view showing a first pixel unit and a second pixel unit according to an embodiment.

FIG. 6A illustrates a top plan view showing a first pixel unit and a second pixel unit according to an embodiment. FIG. 6B illustrates a cross-sectional view showing a first pixel unit and a second pixel unit according to an embodiment. FIG. 7 illustrates a top plan view showing a first pixel unit and a second pixel unit according to an embodiment. Some structures of the first pixel unit and second pixel unit may be identical to or analogous to some structures described above.

Referring to FIG. 6A, the first pixel unit RU1 may include a first color pixel R, a second color pixel G, and a third color pixel B.

Each of the first color pixel R, the second color pixel G, and the third color pixel B included in the first pixel unit RU1 may include a plurality of emission areas. Each of the first color pixel R, the second color pixel G, and the third color pixel B may include four emission areas that are spaced from each other.

A total number of emission areas in each pixel R, G, or B included in the first pixel unit RU1 may be equal to a total number of emission areas in each pixel R, G, or B included in the second pixel unit RU2.

Referring to FIG. 6B, each of the pixels R, G, and B included in the first pixel unit RU1 may include the partition wall IL4 including first partition wall openings OP1-IL4. The first partition wall IL4 may overlap the first emission layer EML1. The partition wall IL4 may include a section positioned between the openings OP1-IL4 and overlapping the first electrode E1 and may include sections overlapping edges of the first electrode E1.

The first partition wall openings OP1-IL4 may overlap the first electrode E1. The number of emission areas provided by one emission layer at the same level may be determined depending on the number of first partition wall openings OP1-IL4 overlapping the first electrode E1. For example, when four first partition wall openings OP1-IL4 overlap the first electrode E1, light emitted from the first emission layer EML1 may include four separate regions.

A shape of each first partition wall opening OP1-IL4 may be the same as that of each second partition wall opening OP2-IL4. The first partition wall openings OP1-IL4 may have a rectangular shape, an octagonal shape, an oval shape, or a circular shape.

The first emission layer EML1 may be positioned on a section of the partition wall IL4 and the first electrode E1. Sections of the first emission layer EML1 may be positioned within the first partition openings OP1-IL4. A section of the first emission layer EML1 may overlap side surfaces and a top surface of the section of the partition wall IL4 positioned between the adjacent first partition wall openings OP1-IL4.

Light supplied from each of the pixels included in the first pixel unit RU1 and the second pixel unit RU2 may be divided into a plurality of regions. Since the first pixel unit RU1 and the second pixel unit RU2 have a similar arrangement, display quality may be improved.

Referring to FIG. 7, each of the first pixel unit RU1 and the second pixel unit RU2 may include a first color pixel R, a second color pixel G, and a third color pixel B. Each of the first color pixel R, the second color pixel G, and the third color pixel B included in the first pixel unit RU1 and the second pixel unit RU2 may include a plurality of divided emission areas, for example, four divided emission areas.

Each of the pixels R, G, and B included in the first pixel unit RU1 may include the partition wall IL4 including first partition wall openings OP1-IL4. A shape of the first partition wall openings OP1-IL4 may be the same as that of the second partition wall openings OP2-IL4. The shape of the first partition wall opening OP1-IL4 may be similar to the shape of the light transmitting opening OP-BM. For example, planar shapes of the first partition wall openings OP1-IL4, the second partition wall openings OP2-IL4, and the light transmitting openings OP-BM may be circular. Since the first pixel unit RU1 and the second pixel unit RU2 have similar emission area structures, display quality may be improved.

Figure 8A:
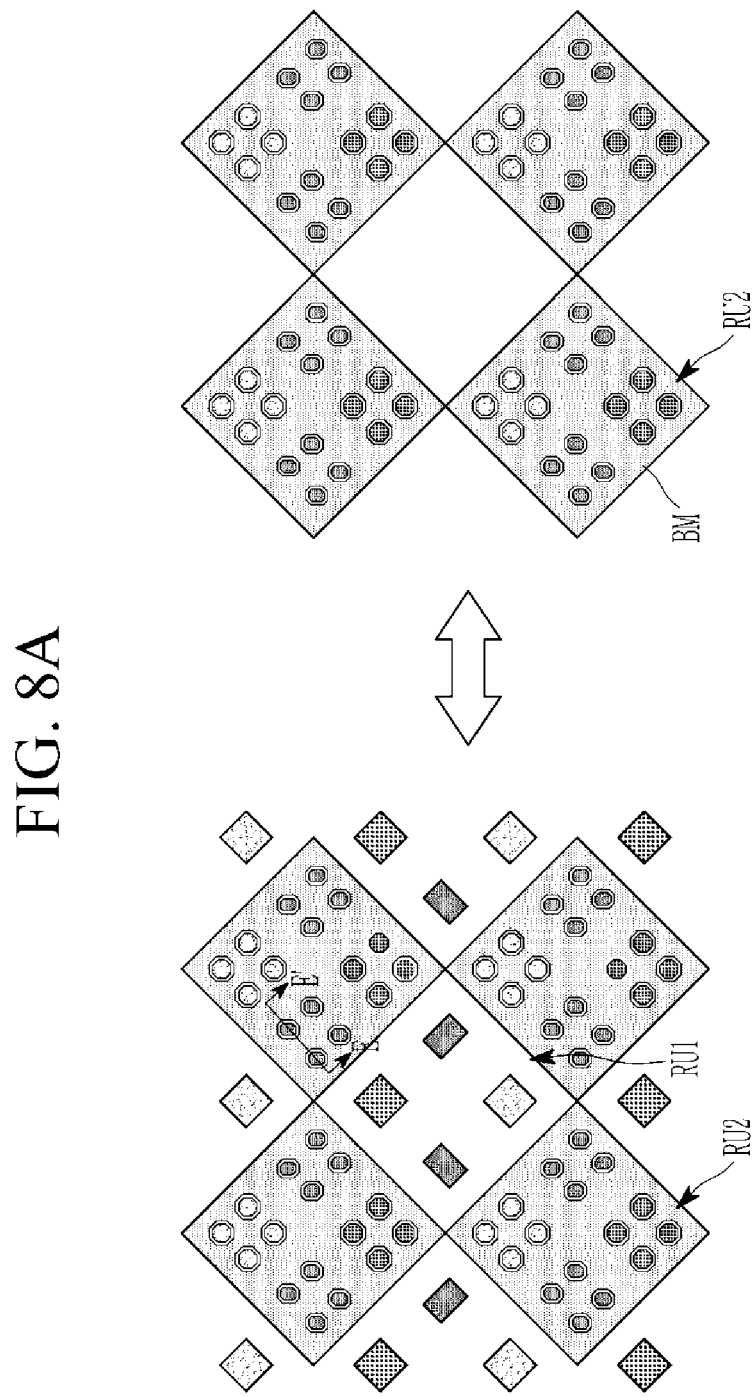
FIG. 8A illustrates a top plan view showing a first pixel unit and a second pixel unit according to an embodiment.
Figure 8B:
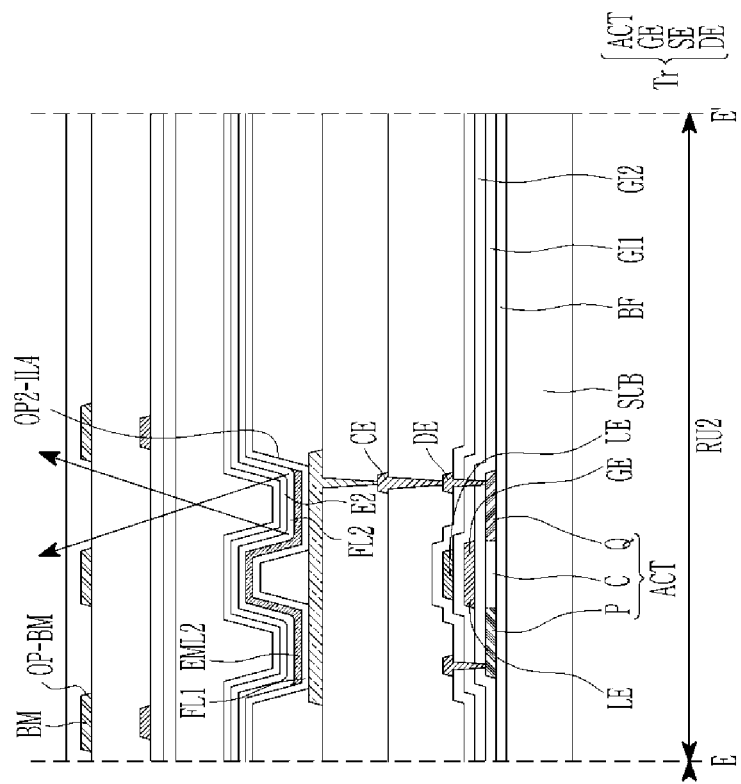
FIG. 8B illustrates a cross-sectional view of a second pixel unit when a privacy protection mode is driven and/or activated according to an embodiment.

FIG. 8A illustrates a top plan view showing a first pixel unit and a second pixel unit according to an embodiment. FIG. 8B illustrates a cross-sectional view of a second pixel unit when a privacy protection mode is operated according to an embodiment.

Referring to FIG. 8A and FIG. 8B, when displaying an image in a normal mode, both the first pixel unit RU1 and the second pixel unit RU2 may be driven, as illustrated at the left side of FIG. 8A. When displaying an image in a privacy protection mode, only the second pixel unit RU2 including the light blocking member BM may be driven, as illustrated at the right side of FIG. 8A.

When only the second pixel unit RU2 is driven, the image may not be recognized from a line of sight at a certain angle or more (e.g., 45 degrees or more) relative to the normal to the display surface. Advantageously, the privacy protection mode may be effective.

Figure 9A:
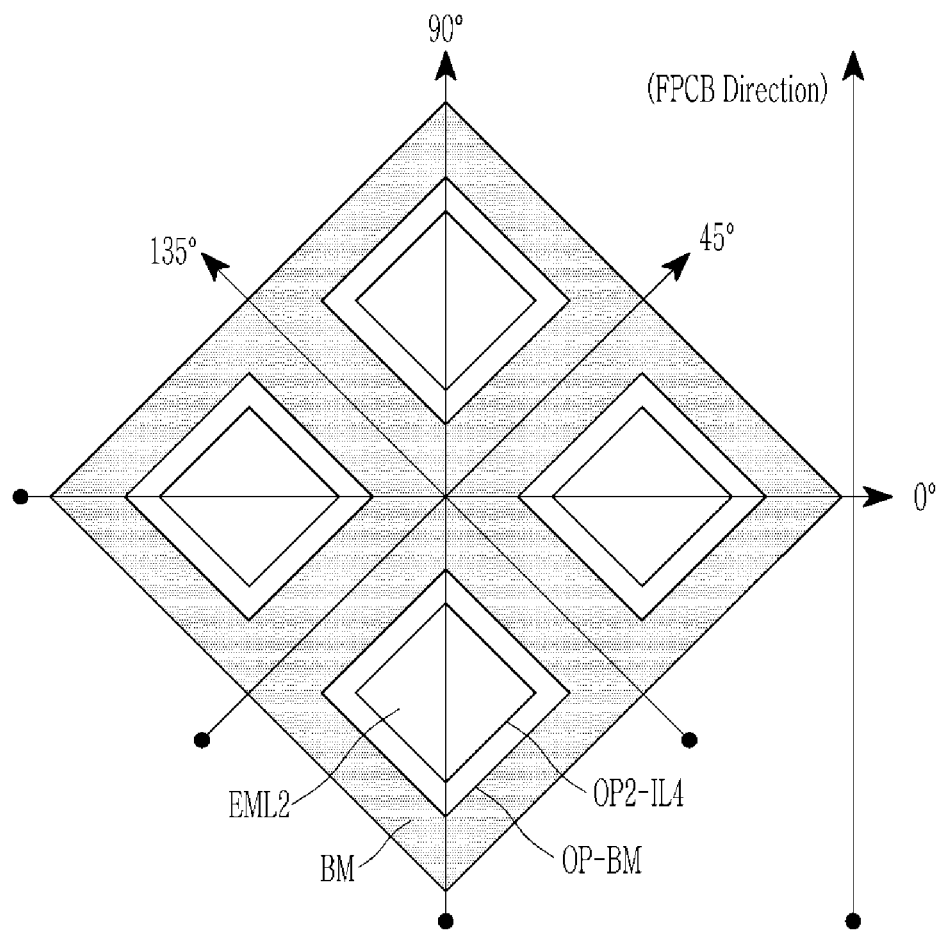
FIG. 9A illustrates a plan view of a second pixel unit according to a comparative example.
Figure 9B:
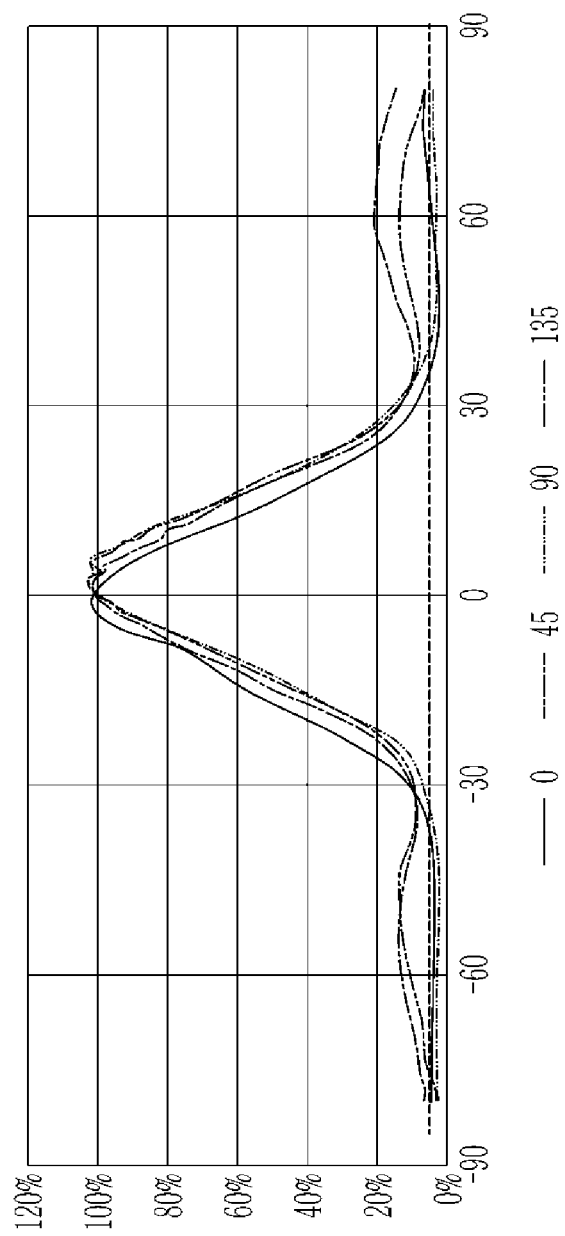
FIG. 9B, FIG. 9C, FIG. 9D, and FIG. 9E illustrate graphs showing luminance for angles illustrated in FIG. 9A.
Figure 9C:
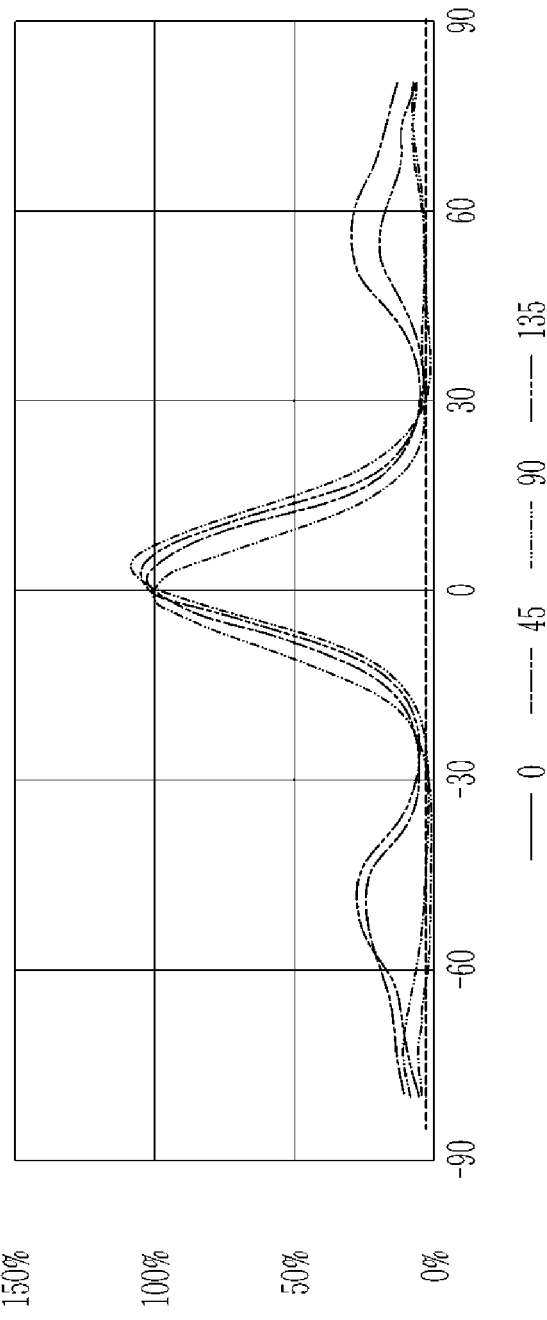
Figure 9D:
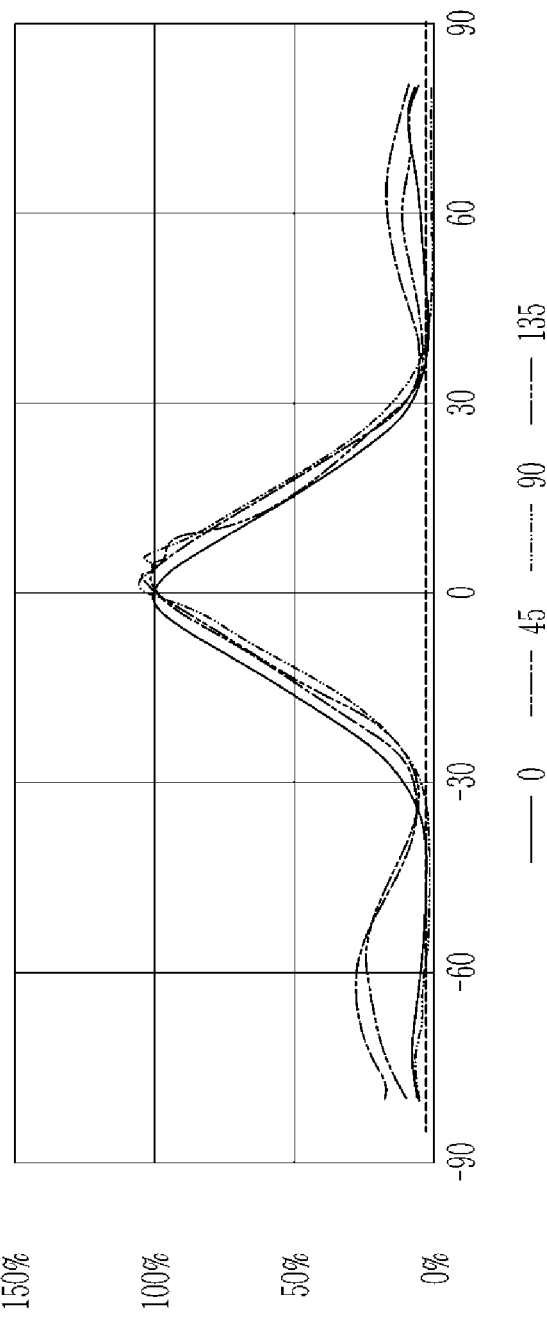
Figure 9E:
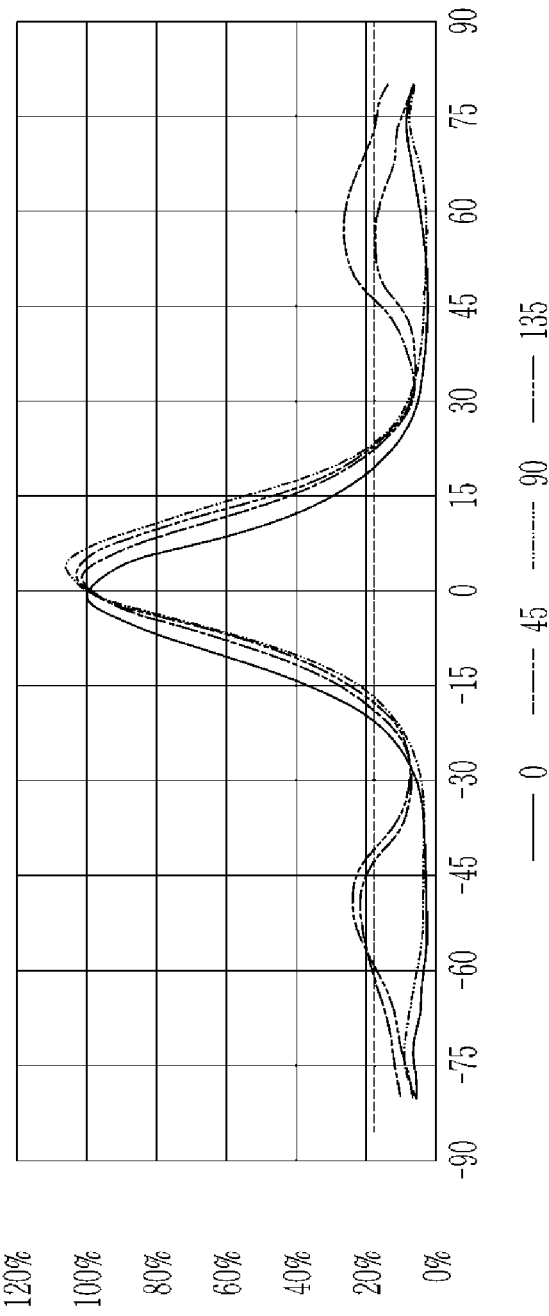
Figure 10A:
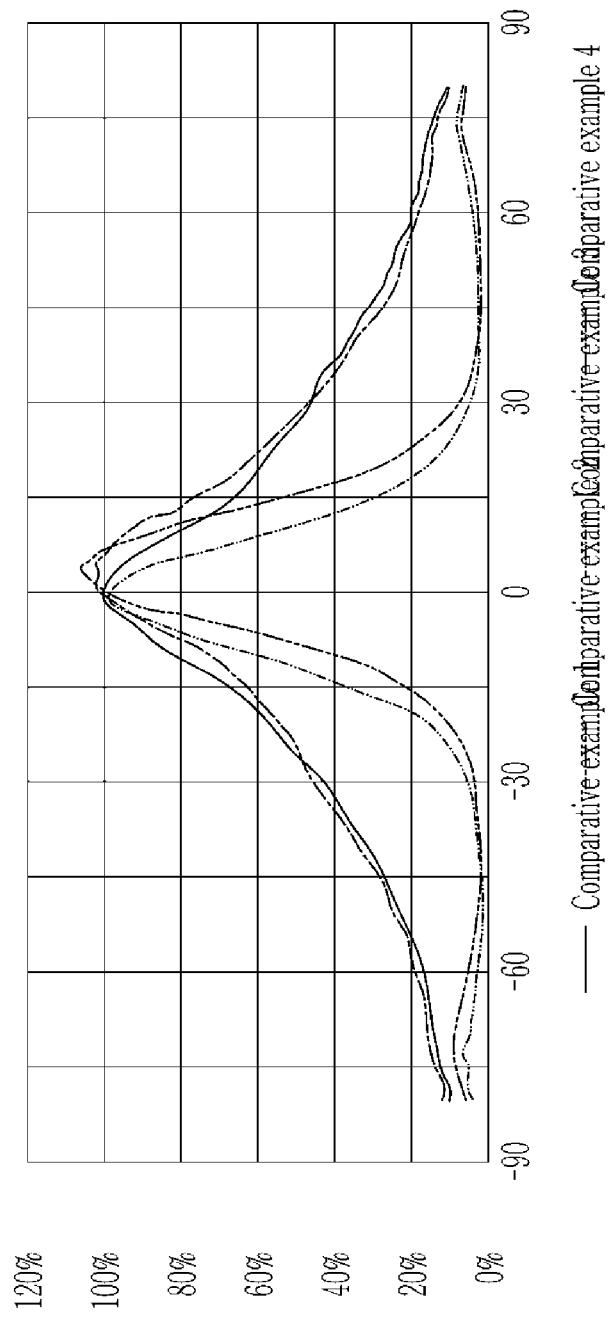
FIG. 10A illustrates a luminance graph in 0-degree and 90-degree directions according to a comparative example.
Figure 10B:
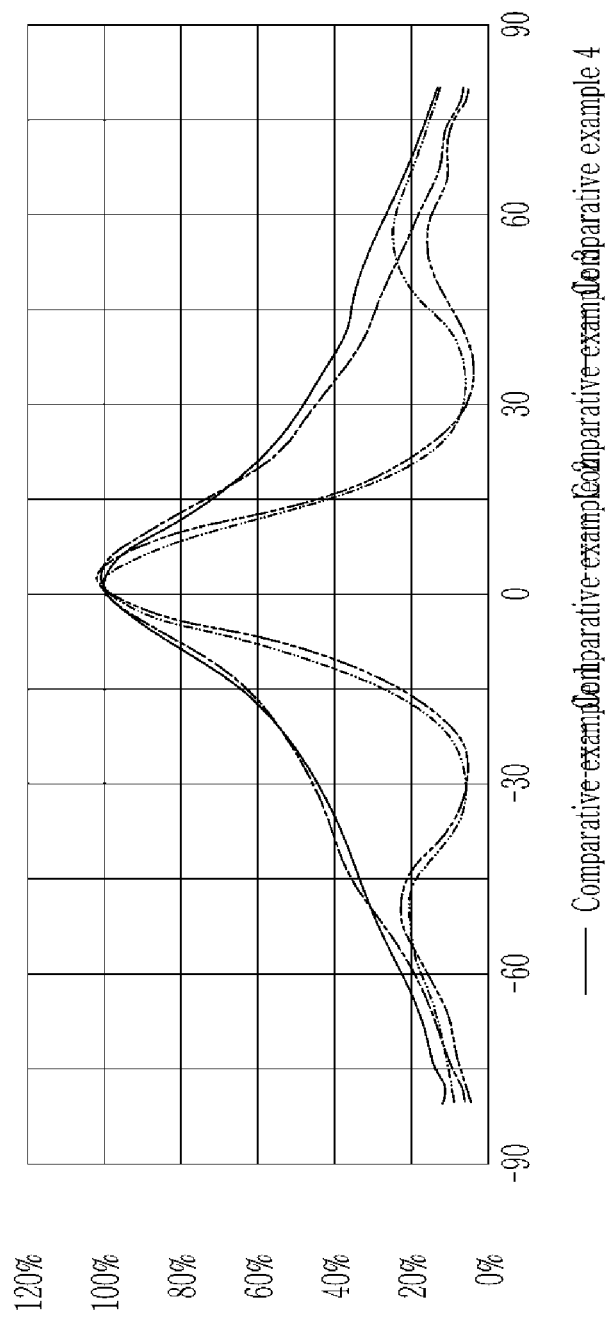
FIG. 10B illustrates a luminance graph in 45-degree and 135-degree directions.

FIG. 9A illustrates a plan view of a second pixel unit according to a comparative example. FIG. 9B, FIG. 9C, FIG. 9D, and FIG. 9E illustrate graphs showing luminance for each angle illustrated in FIG. 9A. FIG. 10A illustrates a luminance graph in 0-degree and 90-degree directions according to a comparative example, and FIG. 10B illustrates a luminance graph in 45-degree and 135-degree directions.

As illustrated in FIG. 9A, the second pixel unit according to the comparative example may include the light transmitting opening OP-BM and the second partition wall opening OP2-IL4 having a rectangular shape. Along the 0-degree, 45-degree, 90-degree, and 135-degree directions, FIG. 9B illustrates a graph showing luminance for red light, FIG. 9C illustrates a graph showing luminance for green light, FIG. 9D illustrates a graph showing luminance for blue light, and FIG. 9E illustrates a graph showing luminance of white light by combining FIG. 9B, FIG. 9C, and FIG. 9D. According to FIG. 9B to FIG. 9E, in a 0-degree or 90-degree direction, when the privacy protection mode is driven, the luminance is almost 0 at a viewing angle of 30 degrees or more, so the privacy protection mode is effective. However, in a 45-degree direction and a 135-degree direction, the luminance is undesirably improved at a viewing angle between about 30 degrees and about 90 degrees. The privacy protection mode is not effective.

FIG. 10A illustrates a luminance graph for 0-degree and 90-degree directions. When the image is provided in the privacy protection mode (Comparative Examples 3 and 4), a luminance limit for driving the privacy protection mode is appropriately performed in contrast to a case of providing the image in the normal mode (Comparative Examples 1 and 2). However, in FIG. 10B for the 45-degree and 135-degree directions, when the image is provided in the privacy protection mode (Comparative Examples 3 and 4), a viewing angle limiting characteristic decreased as the luminance is undesirably improved at 30 degrees or more in contrast to a case of providing the image in the normal mode (Comparative Examples 1 and 2).

Figure 11B:
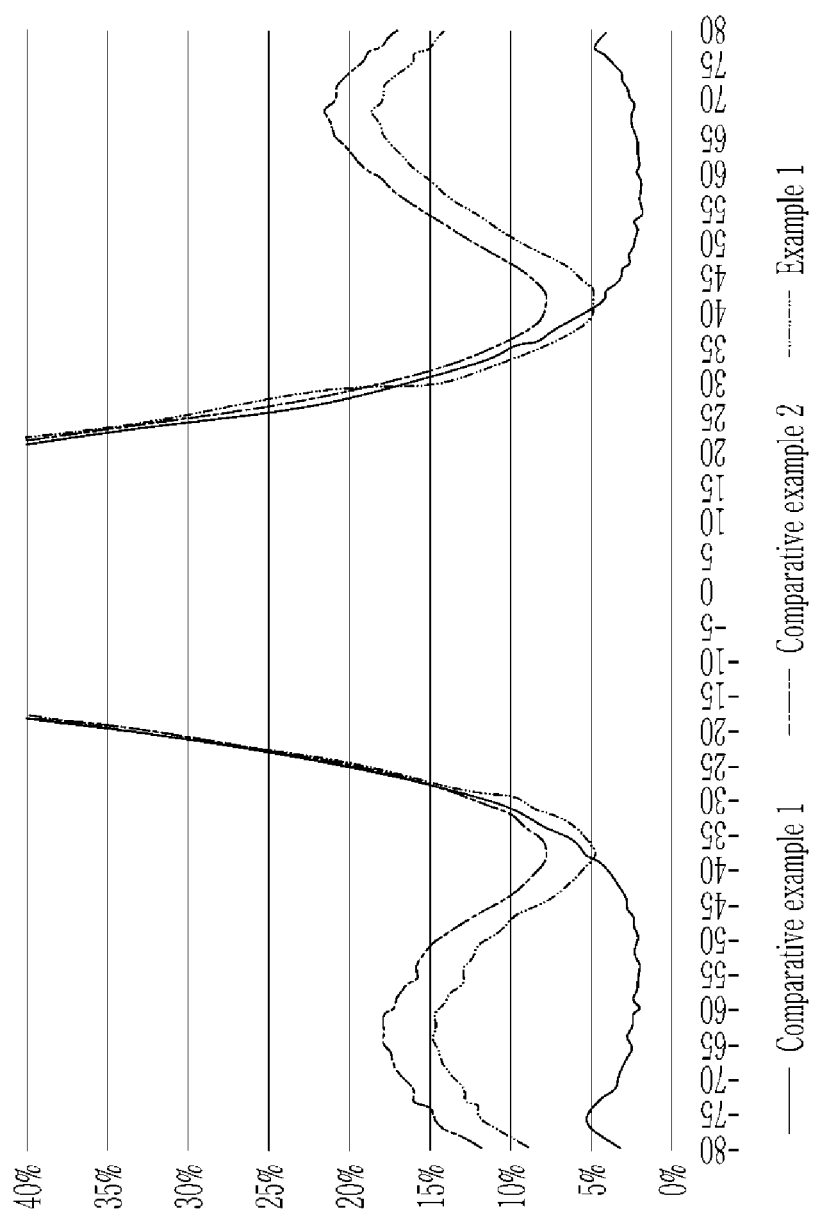

FIG. 11A and FIG. 11B illustrate graphs showing changes in luminance for each angle in an example and a comparative example in which a distance between a perimeter of an opening/hole of a light blocking member and a perimeter of an opening/hole of a partition wall is adjusted.

Referring to FIG. 11A, the viewing angle is 30 degrees or more in the example in which the distance between the light blocking member and the partition wall is increased by about 1.5 micrometers compared to the comparative example. The change in luminance between the comparative example and the example and that the difference in luminance remained about 14% for a 45-degree viewing angle direction indicate that there is a change in luminance of about 0.9% per 0.1 micrometer. That the difference in luminance remained about 10% for a −45-degree viewing angle direction indicates that there is a change in luminance of about 0.7% per 0.1 micrometer.

If the first distance and the second distance between the light blocking member and the partition wall in FIG. 9A are changed to be equal according to embodiments, the difference in luminance may be desirably reduced as according to the reduced distance. For example, when the distance is changed from 1.2 micrometers to 0.8 micrometers, there may be a luminance change of in a range of 3% to 4%. Referring to FIG. 11B, in Comparative Example 1, in which the first distance and the second distance between the light blocking member and the partition wall are the same, the luminance of white light may be more effectively reduced at a specific angle or more in comparison to Comparative Example 2, when the privacy protection mode is driven. In Comparative Example 1, the privacy protection mode is effectively operated.

While illustrative embodiments have been described, practical embodiments are not limited to the described embodiments. Practical embodiments are intended to cover various modifications and equivalent arrangements within the scope of the appended claims.

What is claimed is:

1. A display device comprising:
a first transistor;
a first pixel electrode electrically connected to the first transistor;
a second transistor;
a second pixel electrode electrically connected to the second transistor;
a wall layer including a first hole and a second hole, the first hole exposing the first pixel electrode, the second hole exposing the second pixel electrode;
a common electrode overlapping both the first pixel electrode and the second pixel electrode;
a first emission layer disposed between the first pixel electrode and the common electrode;
a second emission layer disposed between the second pixel electrode and the common electrode;
an encapsulation layer disposed on the common electrode;
a first touch electrode overlapping the encapsulation layer;
an overcoat layer disposed on the first touch electrode; and
a light blocking member overlapping the first touch electrode, including a first opening, and including a second opening, each of the first opening and the second opening exposing the second emission layer, wherein a first perimeter section of the first opening is parallel to a first perimeter section of the second hole and spaced from the first perimeter section of the second hole by a first distance in a first direction in a plan view of the display device,
wherein a second perimeter section of the first opening is parallel to a second perimeter section of the second hole and spaced from the second perimeter section of the second hole by a second distance in a second direction in the plan view of the display device,
wherein the first distance is equal to the second distance,
wherein the first direction is normal to the first perimeter section of the first opening, and
wherein the second direction is normal to the second perimeter section of the first opening and is oriented at 45 degrees with respect to the first direction.

2. The display device of claim 1, wherein the second hole is within the first opening in the plan view of the display device.

3. The display device of claim 2, wherein the wall layer further includes a third hole, and wherein the third hole is spaced from the second hole and exposes the second pixel electrode.

4. The display device of claim 3, wherein a first section of the second emission layer is positioned inside the second hole, wherein a second section of the second emission layer is positioned inside the third hole, and wherein a section of the wall layer is positioned between the first section of the second emission layer and the second section of the second emission layer.

5. The display device of claim 4, wherein the section of the wall layer is positioned between a third section of the second emission layer and the second pixel electrode.

6. The display device of claim 5, wherein a fourth section of the second emission layer overlaps a side surface of the section of wall layer and is connected between the first section of the second emission layer and the third section of the second emission layer.

7. The display device of claim 1, wherein in the plan view of the display device, a shape of the first opening and a shape of the second opening are same.

8. The display device of claim 1, wherein the first opening is octagonal or circular in the plan view of the display device.

9. The display device of claim 1, wherein the second opening has an octagonal or circular shape in the plan view of the display device.

10. The display device of claim 1, wherein the first pixel electrode is smaller or larger than the second pixel electrode.

11. The display device of claim 10, wherein the first pixel electrode is smaller than the second pixel electrode.

12. The display device of claim 1, wherein the light blocking member is spaced from the first touch electrode by the overcoat layer.

13. The display device of claim 1, wherein the light blocking member covers and directly contacts the first touch electrode.

14. The display device of claim 1, wherein the first emission layer is positioned farther than the second emission layer from the overcoat layer.

15. The display device of claim 1, wherein the wall layer includes a first plurality of openings and a second plurality of openings, wherein the first plurality of openings includes the first hole and exposes the first pixel electrode, wherein the second plurality of openings includes the second hole and exposes the second pixel electrode, and wherein a total number of openings of the first plurality of openings is equal to a total number of openings of the second plurality of openings.

16. The display device of claim 1, further comprising: a second touch electrode positioned closer to the first emission layer than to the second emission layer and formed of a same material as the first touch electrode, wherein no pixel electrode analogous to the first pixel electrode or the second pixel electrode is positioned between the first pixel electrode and the second pixel electrode, and wherein no light blocking member formed of a same material as the light blocking member covers the second touch electrode.

17. The display device of claim 16, wherein each of the first opening and the second opening is octagonal or circular in the plan view of the display device.

18. The display device of claim 16, wherein the second pixel electrode is larger than the first pixel electrode.

19. The display device of claim 16, wherein the wall layer further includes a third hole, wherein the third hole is spaced from the second hole and exposes the second pixel electrode, and wherein two sections of the second emission layer are respectively positioned inside the second opening and the third hole.

* * * * *